(12) United States Patent
Sekito

(10) Patent No.: US 8,729,402 B2
(45) Date of Patent: May 20, 2014

(54) POLYIMIDE PRECURSOR COMPOSITION, USE OF THE OF THE SAME, AND PRODUCTION METHOD OF THE SAME

(75) Inventor: Yoshihide Sekito, Shiga (JP)

(73) Assignee: Kaneka Corporation, Osaka (JP)

( * ) Notice: Subject to any disclaimer, the term of this patent is extended or adjusted under 35 U.S.C. 154(b) by 568 days.

(21) Appl. No.: 12/992,450

(22) PCT Filed: May 14, 2009

(86) PCT No.: PCT/JP2009/058974
§ 371 (c)(1),
(2), (4) Date: Nov. 12, 2010

(87) PCT Pub. No.: WO2009/145065
PCT Pub. Date: Dec. 3, 2009

(65) Prior Publication Data
US 2011/0061914 A1    Mar. 17, 2011

(30) Foreign Application Priority Data

May 20, 2008    (JP) .................................. 2008-132562

(51) Int. Cl.
| | | |
|---|---|---|
| H05K 1/00 | (2006.01) | |
| C08G 18/00 | (2006.01) | |
| C08G 77/26 | (2006.01) | |
| C09D 179/08 | (2006.01) | |
| C08F 2/50 | (2006.01) | |
| H05K 3/00 | (2006.01) | |

(52) U.S. Cl.
USPC ............... 174/258; 528/73; 528/28; 524/590; 522/167; 427/99.4

(58) Field of Classification Search
None
See application file for complete search history.

(56) References Cited

U.S. PATENT DOCUMENTS

| | | | | |
|---|---|---|---|---|
| 4,338,427 A | * | 7/1982 | Maekawa et al. ............... | 528/53 |
| 5,021,540 A | * | 6/1991 | Leone-Bay et al. ........... | 528/183 |
| 6,162,893 A | * | 12/2000 | Choi et al. .................... | 528/353 |
| 6,333,391 B1 | * | 12/2001 | Laycock et al. ............... | 528/170 |
| 6,492,030 B1 | * | 12/2002 | Hashimoto et al. ........... | 428/447 |
| 2010/0132989 A1 | | 6/2010 | Fujihara et al. | |

FOREIGN PATENT DOCUMENTS

| | | |
|---|---|---|
| JP | 58-007449 A | 1/1983 |
| JP | 61-162525 A | 7/1986 |
| JP | 11-209609 A | 8/1999 |
| JP | 11-217502 A | 8/1999 |
| JP | 2000-212446 A | 8/2000 |
| JP | 2000-234023 A | 8/2000 |
| JP | 2000-319389 A | 11/2000 |
| JP | 2000-319391 A | 11/2000 |
| JP | 2001-031764 A | 2/2001 |
| JP | 2001-089656 A | 4/2001 |
| JP | 2001-125273 A | 5/2001 |
| JP | 2001-163974 A | 6/2001 |
| JP | 2001-215702 A | 8/2001 |
| JP | 2005-270846 A | 10/2005 |
| JP | 2009-051949 A | 3/2009 |
| WO | 2008/132960 A1 | 11/2008 |

OTHER PUBLICATIONS

International Search Report of PCT/JP2009/058974, mailing date Sep. 8, 2009.
Notification of Transmittal of Translation of the International Preliminary Report on Patentability (Form PCT/IB/338) of International Application No. PCT/JP2009/058974 mailed Jan. 20, 2011 with Forms PCT/IB/373 and PCT/ISA/237.

* cited by examiner

*Primary Examiner* — Randy Gulakowski
*Assistant Examiner* — Jeffrey Washville
(74) *Attorney, Agent, or Firm* — Westerman, Hattori, Daniels & Adrian, LLP

(57) ABSTRACT

An object of the present invention is to provide (i) a polyimide precursor composition which is curable at a low temperature (not more than 250° C.) and which has a low viscosity despite having a high concentration, and a production method thereof, (ii) a polyimide coating film obtained from the polyimide precursor composition and having good properties, and a production method thereof, (iii) a photosensitive resin composition prepared by use of the polyimide precursor composition, and a production method thereof. The object of the present invention can be attained by a polyimide precursor composition containing an imidized tetracarboxylic acid having a specific structure and an isocyanate compound having a specific structure, or optionally a diamine.

7 Claims, No Drawings

ND OF THE SAME

POLYIMIDE PRECURSOR COMPOSITION, USE OF THE OF THE SAME, AND PRODUCTION METHOD OF THE SAME

TECHNICAL FIELD

The present invention relates to a polyimide precursor composition which is curable at a low temperature of not more than 250° C. and which has excellent long-term storage stability, and a production method thereof. The present invention further relates to a polyimide precursor solution, a polyimide coating film, and a photosensitive resin composition, each of which is obtained by use of the polyimide precursor composition, and production methods thereof.

BACKGROUND ART

Polyimide resin has excellent heat resistance, an excellent electrical insulating property, excellent chemical resistance, and a mechanical property, and therefore is used for electric and electronic purposes. For example, the polyimide resin is used as materials of (i) an isolation film and a protective coating agent provided on a semiconductor device, (ii) a surface protective material and a base material resin for a flexible circuit substrate, an integrated circuit, and the like, and (iii) an interlayer insulating film and a protective film for a fine circuit. Particularly, in a case where the polyimide resin is used as a coating material, the polyimide resin is used as (a) a protection material made by applying an adhesive agent on a shaped product such as a polyimide film, (b) a liquid-form polyimide resin solution, and the like.

The polyimide resin solution is roughly classified into two types: one type is a polyamide acid solution, which is a solution of a polyimide resin precursor; and the other type is a polyimide solution that contains polyimide resin soluble in an organic solvent. However, the polyamide acid solution and the polyimide solution are polymer solutions of a high molecular weight polymer and have a large molecular weight and low solubility to a solvent. This makes it difficult to prepare these solutions to have a high solute concentration, and therefore it is necessary to evaporate a large amount of the solvent in order to form a coating film, for example. This renders productivity of the coating film poor. Further, in a case of the solution of the polyimide resin precursor, it is necessary to imidize a coating film, which is formed by applying the solution. At this time, the imidization should be carried out at a heat temperature of more than 300° C. However, in a case where the solution is used, for example, as a protection agent for a flexible substrate or the like, or as an adhesive agent to be applied on a shaped product, since wiring materials cannot endure a high temperature, it is necessary to use resin that is curable at a low temperature (not more than 250° C.) so as not to cause deterioration of wiring lines.

In relation to a technique for providing such a polyimide resin solution, there have been proposed a high-concentration and low-viscosity polyimide precursor solution in which a diamine and either a tetracarboxylic acid or its diester acid derivative are dissolved (see Patent Literatures 1 to 4, for example).

Further, there has been also proposed a high-concentration and low-viscosity polyimide precursor solution in which a diamine and a carboxylic acid having an amide bond in its structure are dissolved (see Patent Literatures 5 to 7, for example).

Moreover, there has been reported a photosensitive resin composition or a plasma etching resist that uses an imide siloxane oligomer having a half-esterified terminal (see Patent Literatures 8 to 11, for example).

CITATION LIST

Patent Literature 1
Japanese Patent Application Publication, Tokukaihei, No. 11-209609 A (1999)
Patent Literature 2
Japanese Patent Application Publication, Tokukaihei, No. 11-217502 A (1999)
Patent Literature 3
Japanese Patent Application Publication, Tokukai, No. 2000-319389 A
Patent Literature 4
Japanese Patent Application Publication, Tokukai, No. 2000-319391 A
Patent Literature 5
Japanese Patent Application Publication, Tokukai, No. 2001-31764 A
Patent Literature 6
Japanese Patent Application Publication, Tokukai, No. 2001-163974 A
Patent Literature 7
Japanese Patent Application Publication, Tokukai, No. 2000-234023 A
Patent Literature 8
Japanese Patent Application Publication, Tokukai, No. 2000-212446 A
Patent Literature 9
Japanese Patent Application Publication, Tokukai, No. 2001-89656 A
Patent Literature 10
Japanese Patent Application Publication, Tokukai, No. 2001-125273 A
Patent Literature 11
Japanese Patent Application Publication, Tokukai, No. 2001-215702 A

SUMMARY OF INVENTION

Technical Problem

Patent Literatures mentioned above disclose various methods for preparing a polyimide resin solution in a high concentration. However, the solution of a salt disclosed in Patent Literatures 1 to 4 that uses a diamine and a tetracarboxylic acid or its diester acid derivative requires a very high imidization temperature. It is accordingly demonstrated that the solution of the salt is not curable at a low temperature. Further, in a case of the polyamide acid solutions having an amide bond, which are disclosed in Patent Literatures 5 to 7, it is found that they have poor stability because the amide bond is easily broken. In particular, the viscosity of these solutions fluctuates largely when the solutions are prepared in a high concentration. Meanwhile, in a case of the imide siloxane oligomers having a half-esterified terminal, which are disclosed in Patent Literatures 8 to 11, there arise the following problems, for example. That is, (i) a imidization temperature is high at the time when organic molecules are desorbed from an ester compound and (ii) that alcoholic desorption substances are not easily evaporated from a polyimide coating film, thereby causing air bubbles in some cases.

The present invention is accomplished n view of the above problems. An object of the present invention is to provide (i) a polyimide precursor solution which is curable at a low temperature (not more than 250° C.) and which has a low viscosity despite having a high concentration, (ii) a production method of the polyimide precursor solution, (iii) a polyimide coating film and a photosensitive resin composition, each of which is obtained by use of the polyimide precursor solution and has good properties, and (iv) production methods of the polyimide coating film and the photosensitive resin composition.

Solution to Problem

As a result of diligent study to attain the above object, inventors of the present invention found that a polyimide coating film that is curable at a low temperature and has good physical properties is obtainable with the use of a composition containing an imidized tetracarboxylic acid and an isocyanate compound. In other words, the inventors found a fact that a polyimide precursor composition containing an imidized tetracarboxylic acid represented by the after-mentioned General Formula (1) and an isocyanate compound exhibits a low viscosity even if a solution containing the polyimide precursor composition is prepared to have a high concentration of solute dissolved therein. Further, the inventors also found a fact that with the use of the solution containing the polyimide precursor composition, it is possible to obtain a polyimide coating film having high strength. Based on these facts, the inventors accomplished the present invention. The present invention can attain the above object by a novel polyimide resin precursor composition described below. That is, the present invention provides a polyimide precursor composition containing an isocyanate compound and an imidized tetracarboxylic acid represented by General Formula (1):

[Chem. 1]

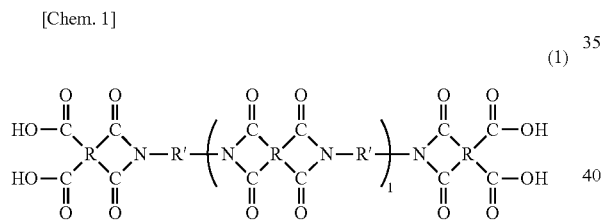

(1)

wherein each R independently represents a tetravalent organic group; each R' independently represents a divalent organic group; and 1 represents an integer of 0 to 20.

Further, it is preferable that the polyimide precursor composition further contain a diamine represented by General Formula (2):

[Chem. 2]

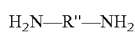

(2)

wherein R" represents a divalent organic group.

Further, it is preferable that R in General Formula (1) be a tetravalent organic group selected from General Formula Group (1):

[Chem. 3]

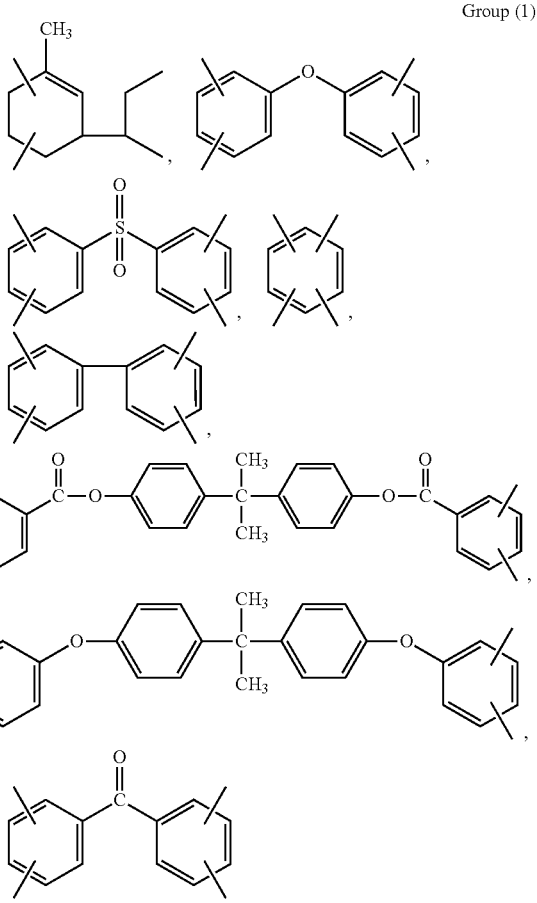

Group (1)

Further, it is preferable that R' in General Formula (1) has at least a divalent organic group selected from General Formula Group (2):

[Chem. 4]

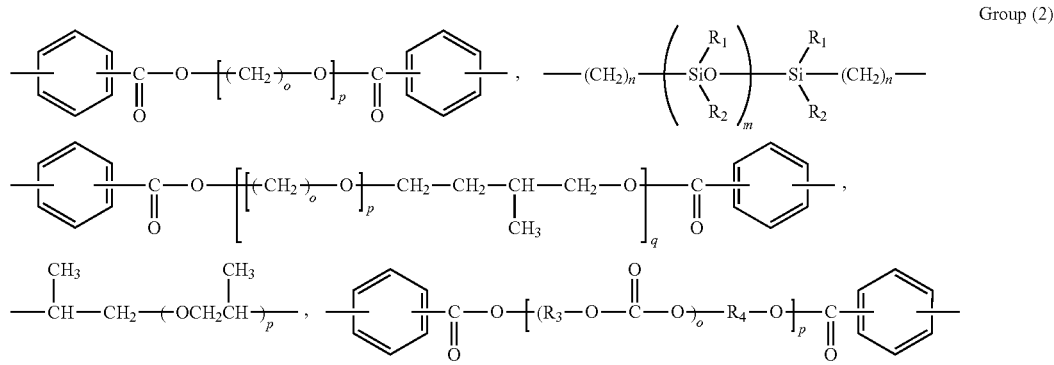

Group (2)

wherein o, p, and q each independently represent an integer of 1 to 30; $R_1$ and $R_2$ each independently represent an alkyl group having 1 to 12 carbon atoms or an aromatic group; m represents an integer of 1 to 40; n represents an integer of 1 to 20; and $R_3$ and $R_4$ each independently represent an alkyl group having 1 to 12 carbon atoms.

Further, it is preferable that R″ in General Formula (2) be a divalent organic group selected from General Formula Group (3):

[Chem. 5]

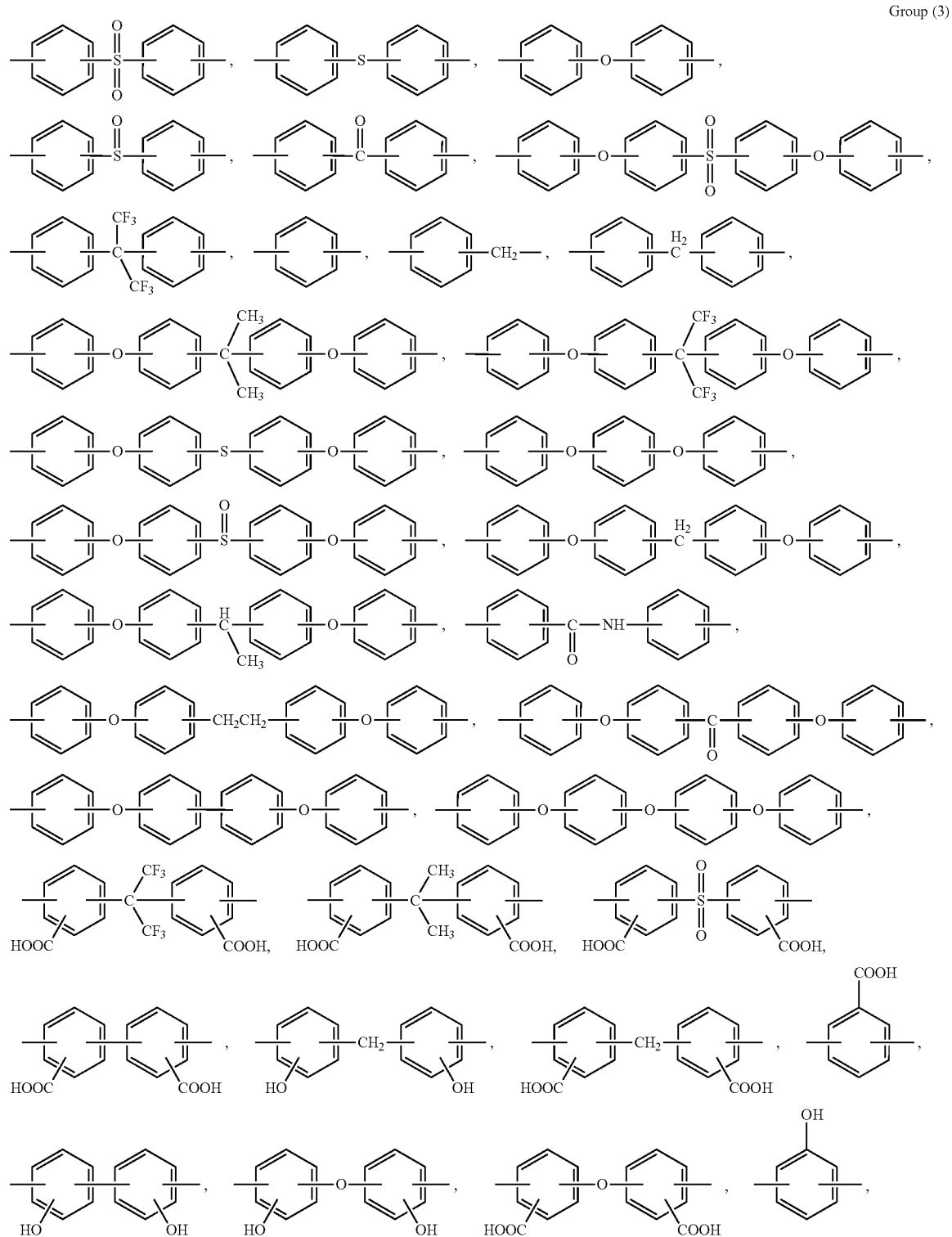

Group (3)

-continued

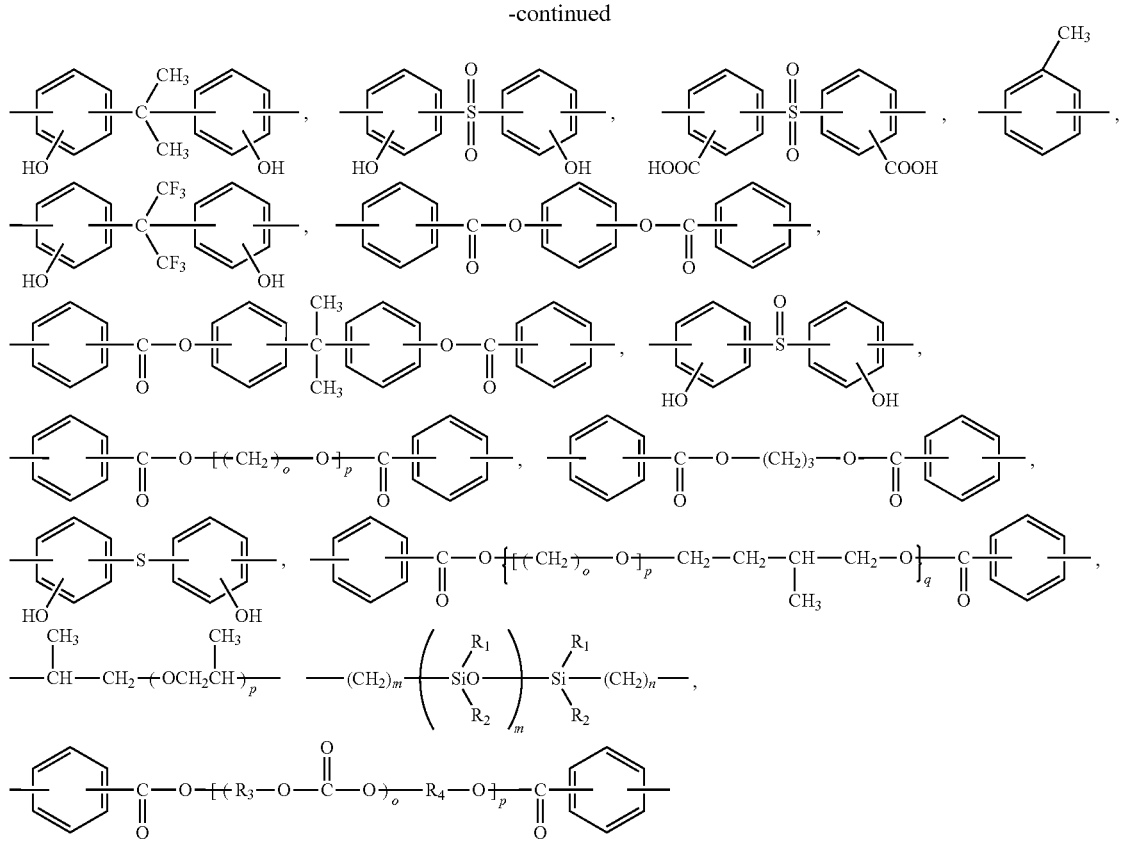

wherein o, p, and q each independently represent an integer of 1 to 30; $R_1$ and $R_2$ each independently represent an alkyl group having 1 to 12 carbon atoms or an aromatic group; m represents an integer of 1 to 40; n represents an integer of 1 to 20; and $R_3$ and $R_4$ each independently represent an alkyl group having 1 to 12 carbon atoms.

Further, the present invention also provides a polyimide precursor composition solution obtained by dissolving a polyimide precursor composition so that the polyimide precursor composition solution has a solute concentration of 40 to 90% by weight.

Moreover, the present invention also provides a polyimide coating film obtained from either the aforementioned polyimide precursor composition or the aforementioned polyimide precursor composition solution.

The present invention further provides a printed wiring board including a polyimide coating film obtained by (i) applying, to the printed wiring board, either the aforementioned polyimide precursor composition or the aforementioned polyimide precursor composition solution, and then (ii) heating and imidizing the polyimide precursor composition or the polyimide precursor composition solution thus applied.

The present invention further provides a photosensitive resin composition containing the aforementioned polyimide precursor composition, and at least a photosensitive resin and a photopolymerization initiator.

Moreover, the present invention also provides a method for producing a polyimide precursor composition, which method includes the steps of: (a) carrying out a reaction between a tetracarboxylic acid dianhydride represented by General Formula (3):

[Chem. 6]

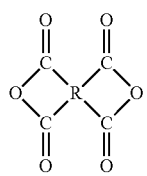

(3)

(wherein R represents a tetravalent organic group) and a diamine represented by General Formula (4):
[Chem. 7]

$$H_2N-R'-NH_2 \quad (4)$$

(wherein R' represents a divalent organic group) such that the diamine represented by General Formula (4) is added by 0.20 to 0.80 moles relative to 1 mole of the tetracarboxylic acid dianhydride represented by General Formula (3), so as to prepare an amide acid; (b) imidizing the amide acid thus prepared, so as to prepare an imide; (c) reacting the imide with water to prepare an imidized tetracarboxylic acid in which an inner part thereof is imidized and a terminal thereof is a tetracarboxylic acid; and (d) mixing the imidized tetracarboxylic acid prepared in the step (c) and an isocyanate compound such that the isocyanate compound is added so that a total amount of the isocyanate compound and the diamine represented by General Formula (4), which is used in the step (a), is 0.70 moles to 1.30 moles relative to 1 mole of the imidized tetracarboxylic acid.

In the method of the present invention, it is preferable that the diamine represented by General Formula (4) include at least a diamine selected from General Formula Group (4):

[Chem. 8]

Group (4)

$$H_2N-\!\!\!\left\langle\!\!\bigcirc\!\!\right\rangle\!\!-\!\!\overset{\text{O}}{\underset{\|}{C}}\!-\!O\!-\!\!\left[\!(CH_2)_o\!-\!O\right]_p\!\!-\!\!\overset{\text{O}}{\underset{\|}{C}}\!-\!\!\left\langle\!\!\bigcirc\!\!\right\rangle\!\!-\!\!NH_2, \quad H_2N-(CH_2)_n\!-\!\!\left(\!\!\begin{array}{c}R_1\\ \diagup\\ SiO\\ \diagdown\\ R_2\end{array}\!\!\right)_{\!\!m}\!\!-\!\!\begin{array}{c}R_1\\ \diagup\\ Si\\ \diagdown\\ R_2\end{array}\!\!-\!(CH_2)_n\!-\!NH_2$$

$$H_2N-\!\!\!\left\langle\!\!\bigcirc\!\!\right\rangle\!\!-\!\!\overset{\text{O}}{\underset{\|}{C}}\!-\!O\!-\!\!\left[\!\!\left[\!(CH_2)_o\!-\!O\right]_p\!\!-\!CH_2\!-\!CH_2\!-\!\underset{\underset{CH_3}{|}}{CH}\!-\!CH_2\!-\!O\right]_{\!\!q}\!\!-\!\!\overset{\text{O}}{\underset{\|}{C}}\!-\!\!\left\langle\!\!\bigcirc\!\!\right\rangle\!\!-\!NH_2,$$

$$H_2N-\underset{\underset{CH_3}{|}}{CH}-CH_2-\!\!\left(\!OCH_2\underset{\underset{CH_3}{|}}{CH}\!\right)_{\!\!p}\!\!-\!NH_2, \quad H_2N-\!\!\left\langle\!\!\bigcirc\!\!\right\rangle\!\!-\!\!\overset{\text{O}}{\underset{\|}{C}}\!-\!O\!-\!\!\left[(R_3\!-\!O)_o\!-\!\overset{\text{O}}{\underset{\|}{C}}\!-\!O\!)_o\!-\!R_4\!-\!O\right]_{\!\!p}\!\!-\!\!\overset{\text{O}}{\underset{\|}{C}}\!-\!\!\left\langle\!\!\bigcirc\!\!\right\rangle\!\!-\!NH_2$$

wherein o, p, and q each independently represent an integer of 1 to 30; $R_1$ and $R_2$ each independently represent an alkyl group having 1 to 12 carbon atoms or an aromatic group; m represents an integer of 1 to 40; n represents an integer of 1 to 20; and $R_3$ and $R_4$ each independently represent an alkyl group having 1 to 12 carbon atoms.

The present invention further provides a method for producing a polyimide precursor composition solution, which method includes the step of: dissolving into an organic solvent a polyimide precursor composition produced by the aforementioned method so that the polyimide precursor composition solution has a solute concentration of 40 to 90% by weight.

Furthermore, the present invention provides a method for producing a polyimide coating film, which method includes the step of forming the polyimide coating film from either a polyimide precursor composition produced by the aforementioned method, or a polyimide precursor composition solution produced by the aforementioned method.

Furthermore, the present invention provides a method for producing a printed wiring board including a polyimide coating film, which method includes the steps of applying to a printed wiring board a polyimide precursor composition produced by the aforementioned method, or a polyimide precursor composition solution produced by the aforementioned method; and heating and imidizing the polyimide precursor composition or the polyimide precursor composition solution thus applied.

The present invention further provides a method for producing a photosensitive resin composition, which method includes the step of mixing a polyimide precursor composition produced by the aforementioned method, at least a photosensitive resin, and a photopolymerization initiator.

Advantageous Effects of Invention

In a case where the polyimide precursor composition of the present invention is dissolved in an organic solvent, a resultant solution has a low, viscosity despite having a high concentration of solute dissolved therein. Further, the polyimide coating film of the present invention, obtained from the polyimide precursor composition, has excellent adhesiveness, excellent stability in environmental test resistance, excellent chemical resistance, and excellent flexibility, and has good physical properties. In view of this, the polyimide coating film of the present invention can be used as protective films or the like provided on various wiring boards, and yields excellent effects. Further, the photosensitive resin composition of the present invention, produced by use of the polyimide precursor composition, is a photosensitive resin composition which is curable at a low temperature and which expresses various excellent physical properties when it is applied in a certain shape on a wiring board. Further, in accordance with the production method of the present invention for producing a polyimide precursor composition, it is possible to easily produce a polyimide precursor solution having a high concentration and a low viscosity. Moreover, in accordance with the production method of the present invention for producing a polyimide coating film, it is possible to easily produce a polyimide coating film. Furthermore, in accordance with the production method of the present invention for producing a photosensitive resin composition, it is possible to produce a photosensitive resin composition having various excellent physical properties as a photosensitive resin composition.

DESCRIPTION OF EMBODIMENTS

The following describes the present invention more specifically. A polyimide precursor composition of the present invention is a polyimide precursor composition containing at least an isocyanate compound and an imidized tetracarboxylic acid represented by General Formula (1):

[Chem. 9]

(1)

$$HO-\overset{O}{\underset{\|}{C}}\overset{O}{\underset{\|}{C}}\!\!\diagdown\!\!\underset{R}{\phantom{X}}\!\!\diagup\!\!\overset{O}{\underset{\|}{C}}\!\!-\!\!N\!-\!R'\!\!\left(\!\!-\!\!N\!\!\diagdown\!\!\overset{O}{\underset{\|}{C}}\!\!\diagup\!\!\underset{R}{\phantom{X}}\!\!\diagdown\!\!\overset{O}{\underset{\|}{C}}\!\!-\!\!N\!-\!R'\!\!\right)_{\!\!l}\!\!-\!\!N\!\!\diagdown\!\!\overset{O}{\underset{\|}{C}}\!\!\diagup\!\!\underset{R}{\phantom{X}}\!\!\diagdown\!\!\overset{O}{\underset{\|}{C}}\!-\!OH$$
$$HO-\overset{O}{\underset{\|}{C}}\!\!\diagup\!\!\overset{O}{\underset{\|}{C}}\!-\!OH$$

(wherein each R independently represents a tetravalent organic group; each R' independently represents a divalent organic group; and l represents an integer of 0 to 20). The polyimide precursor composition of the present invention indicates a composition (i) which contains the structure of General Formula (1) and the isocyanate compound but (ii) in which the structure of General Formula (1) and the isocyanate compound are not covalently bonded. That is, generally, a polyimide precursor composition indicates, for example, a polymer in which the structure of General Formula (1) and an aromatic diamine are partially covalently bonded via an amide bond. However, the polyimide precursor composition of the present invention indicates a composition in which the structure of General Formula (1) and the isocyanate compound have no covalent bond. Such a polyimide precursor composition having no covalent bond makes it possible to increase the concentration of a solution in which the structure of General Formula (1) and the isocyanate compound are dissolved, thereby making it possible to restrain a change in viscosity (change in molecular weight) of the solution.

<Imidized Tetracarboxylic Acid>

The imidized tetracarboxylic acid is a tetracarboxylic acid which has at least two imide bonds in its structural formula and a terminal of which has a tetracarboxylic acid, as represented by General Formula (1):

[Chem. 10]

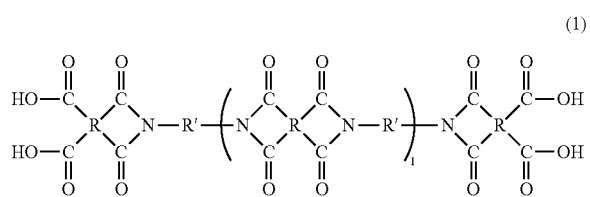

(1)

(wherein each R independently represents a tetravalent organic group; each R' independently represents a divalent organic group; and l represents an integer of 0 to 20). Further, the imidized tetracarboxylic acid of the present invention preferably has a molecular weight as low as possible because the solubility thereof in an organic solvent solution is improved. For example, the imidized tetracarboxylic acid of the present invention is preferably an oligomer, which is a polymer having a relatively low molecular weight. In such a tetracarboxylic acid structure, although the tetracarboxylic acid is imidized, the solubility thereof in a solvent can be increased. Further, since a bond in the structure is not an amide bond but an imide bond, the imidized tetracarboxylic acid has excellent storage stability. Therefore, when a solution of the polyimide precursor composition is prepared, degradation of solution viscosity over time can be prevented, thereby suppressing a change in viscosity.

Especially, it is preferable that each R in General Formula (1) have a structure selected from General Formula Group (1):

[Chem. 11]

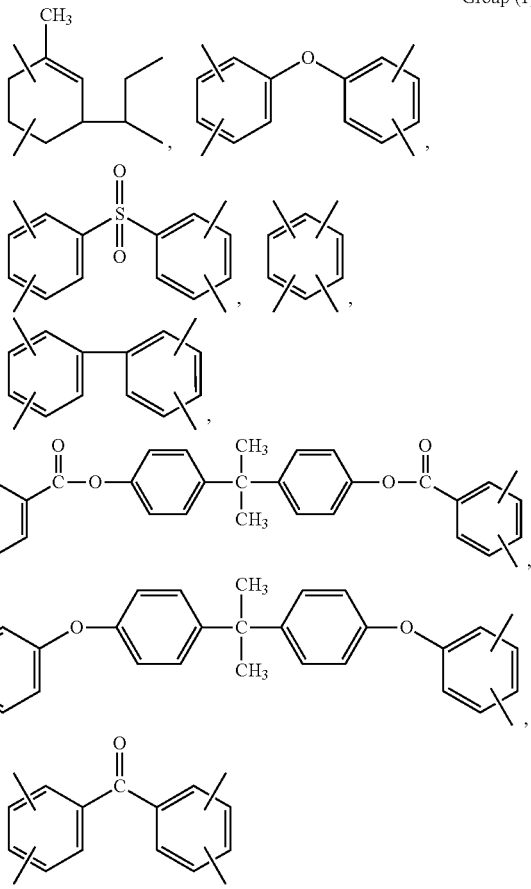

Group (1)

As described above, the structure selected from General Formula Group (1) is especially preferable because the solubility of the tetracarboxylic acid in an organic solvent is increased, thereby making it possible to prepare a polyimide precursor solution in a high concentration.

Furthermore, it is preferable that each R' in General Formula (1) have at least a divalent organic group selected from General Formula Group (2):

[Chem. 12]

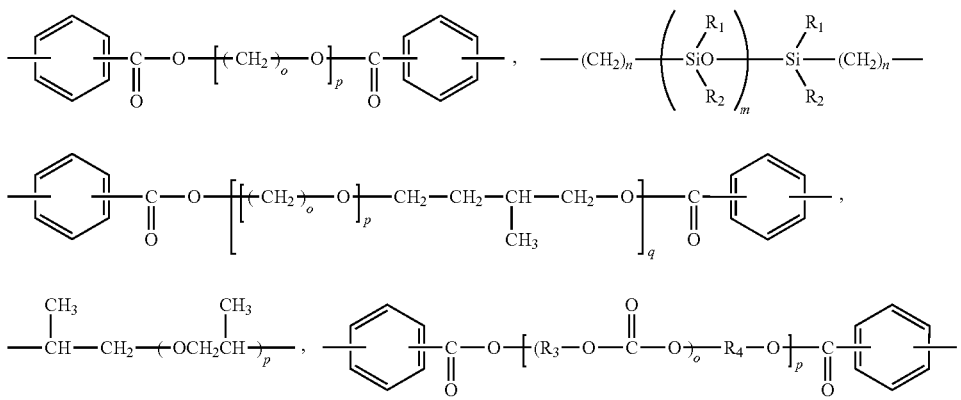

Group (2)

The structure of General Formula (1) can be obtained by reacting a tetracarboxylic acid dianhydride represented by General Formula (3):

[Chem. 13]

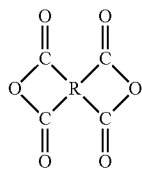

(3)

(where R represents a tetravalent organic group) with a diamine represented by General Formula (4):
[Chem. 14]

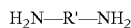

$H_2N-R'-NH_2$ (4)

(where R' represents a divalent organic group).

More specifically, as the tetracarboxylic acid dianhydride represented by General Formula (3), it is preferable to use 3,3',4,4'-benzophenone tetracarboxylic acid dianhydride, pyromellitic acid dianhydride, 3,3',4,4'-oxydiphthalic acid dianhydride, 2,2-bis[4-(3,4-dicarboxyphenoxy)phenyl]propane dianhydride, 2,2-bis(4-hydroxyphenyl)propane dibenzoate-3,3',4,4'-tetracarboxylic acid dianhydride, 3,3',4,4'-diphenyl sulfone tetracarboxylic acid dianhydride, 3,3',4,4'-biphenyltetracarboxylic acid dianhydride, 2,3,3',4-biphenyltetracarboxylic acid dianhydride, or 5-(2,5-dioxotetrahydro-3-furanyl)-3-methyl-3-cyclohexene-1,2-dicarboxylic acid anhydride. In particular, it is preferable to use 2,2-bis[4-(3,4-dicarboxyphenoxy)phenyl]propane dianhydride, 3,3',4,4'-diphenyl sulfone tetracarboxylic acid dianhydride, 3,3',4,4'-oxydiphthalic acid dianhydride, or 5-(2,5-dioxotetrahydro-3-furanyl)-3-methyl-3-cyclohexene-1,2-dicarboxylic acid anhydride, in view of an improvement in solubility of the polyimide precursor and chemical resistance of the polyimide resin. Furthermore, among these, 2,2-bis[4-(3,4-dicarboxyphenoxy)phenyl]propane dianhydride can be particularly preferably used from the viewpoint of improving the solubility and characteristics of a resultant film.

In the diamine represented by General Formula (4), more specifically, it is preferable that R' have a structure containing at least a divalent organic group selected from General Formula group (2):

[Chem. 15]

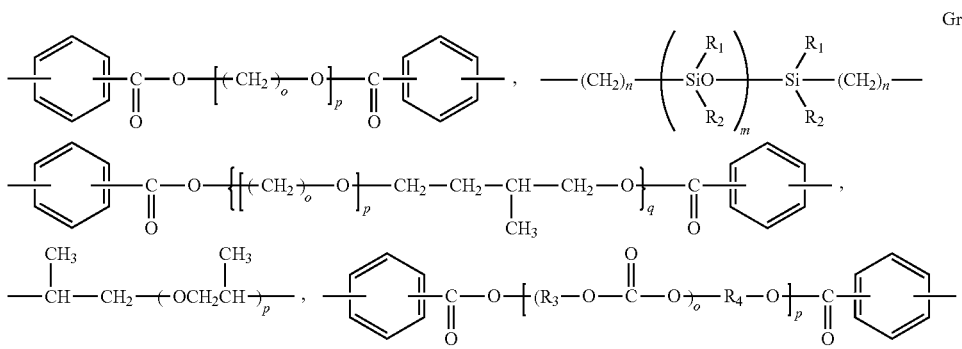

Group (2)

(wherein o, p, and q each independently represent an integer of 1 to 30; $R_1$ and $R_2$ each independently represent an alkyl group having 1 to 12 carbon atoms or an aromatic group; m represents an integer of 1 to 40; n represents an integer of 1 to 20; and $R_3$ and $R_4$ each independently represent an alkyl group having 1 to 12 carbon atoms).

In a case where the above structural skeleton is contained, flexibility can be imparted to a coating film of a polyimide resin when the polyimide resin is formed. Further, in this case, it is also possible to decrease an imidization temperature at the time of forming the polyimide resin. With the use of the structural skeleton in combination, it is further possible to decrease the imidization temperature of the polyimide resin to not more than 250° C.

It is especially preferable that R' have a structure selected from General Formula Group (5):

[Chem. 16]

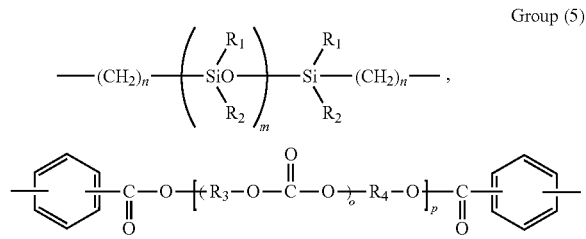

Group (5)

(wherein $R_1$ and $R_2$ each independently represent an alkyl group having 1 to 12 carbon atoms or an aromatic group; m represents an integer of 1 to 40; n represents an integer of 1 to 20; and $R_3$ and $R_4$ each independently represent an alkyl group having 1 to 12 carbon atoms).

The use of the above structure as R' is preferable because (i) flexibility can be imparted to an obtained polyimide coating film, (ii) the imidization temperature is decreased, (iii) a concentration of solute can be adjusted to be high, and (iv) adhesiveness of the polyimide coating film to a base material is improved.

Introduction of the above structure into the structural skeleton can be attained by use of a long-chain diamine selected from General Formula Group (4):

[Chem. 17]

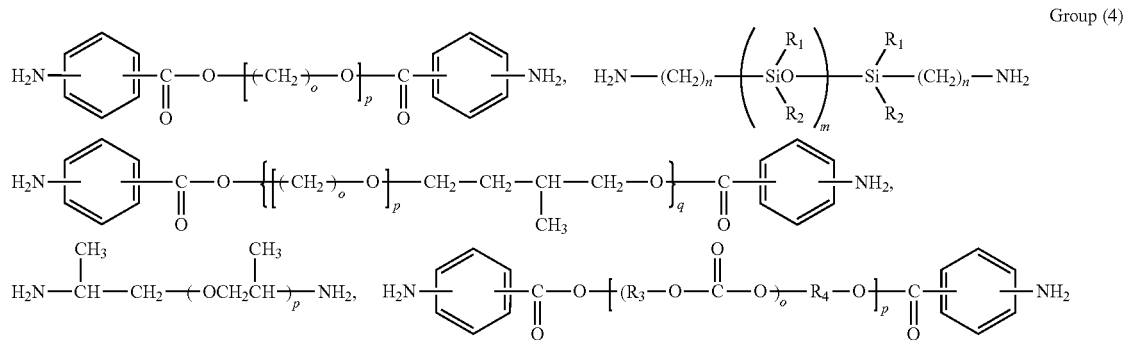
Group (4)

(wherein o, p, and q each independently represent an integer of 1 to 30; $R_1$ and $R_2$ each independently represent an alkyl group having 1 to 12 carbon atoms or an aromatic group; m represents an integer of 1 to 40; n represents an integer of 1 to 20; and $R_3$ and $R_4$ each independently represent an alkyl group having 1 to 12 carbon atoms).

Among General Formula Group (4), in view of the adhesiveness to a base material, the long-chain diamine is preferably selected from General Formula Group (6):

[Chem. 18]

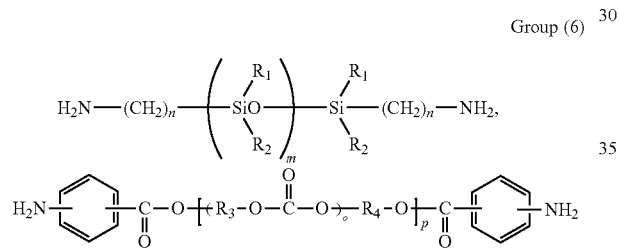
Group (6)

(wherein o and p each independently represent an integer of 1 to 30; $R_1$ and $R_2$ each independently represent an alkyl group having 1 to 12 carbon atoms or an aromatic group; m represents an integer of 1 to 40; n represents an integer of 1 to 20; and $R_3$ and $R_4$ each independently represent an alkyl group having 1 to 12 carbon atoms).

Especially, as for a structure of a silicon diamine used in the present invention, such a structure is preferably used that: each of $R_1$ and $R_2$ is a methyl group, an ethyl group, or a phenyl group; m is an integer of 1 to 40; and n is an integer of not less than 2. When such a structure is used, solute can be dissolved in a high concentration.

Further, such a structure is also preferably used that: $R_3$ is a heptamethylene group, a hexamethylene group, a pentamethylene group, a tetramethylene group, or a trimethylene group; and o and p each independently is an integer of 1 to 30.

Such a structure described above is preferable because flexibility can be imparted to a resultant polyimide resin and adhesiveness of the resultant polyimide resin to a base material is improved.

In the course of producing the imidized tetracarboxylic acid, it is possible to use, in combination, a diamine represented by General Formula (5), as needed:
[Chem. 19]

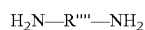
$$H_2N\text{---}R''''\text{---}NH_2 \qquad (5)$$

(wherein R'''' represents a divalent organic group).

As for the diamine represented by General Formula (5), R'''' has, more specifically, a structure containing at least a divalent organic group selected from General Formula Group (7):

[Chem. 20]

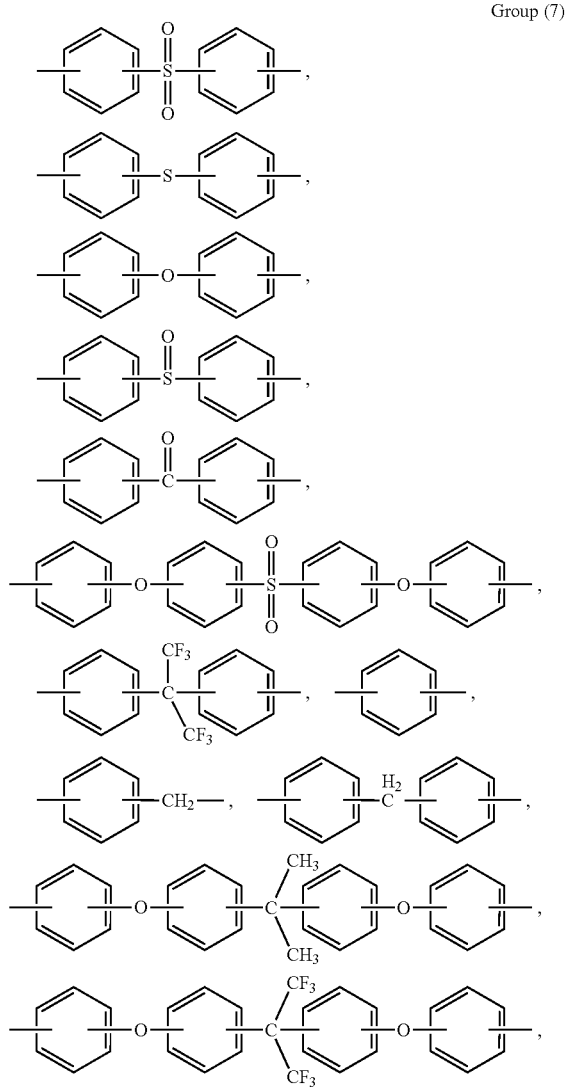
Group (7)

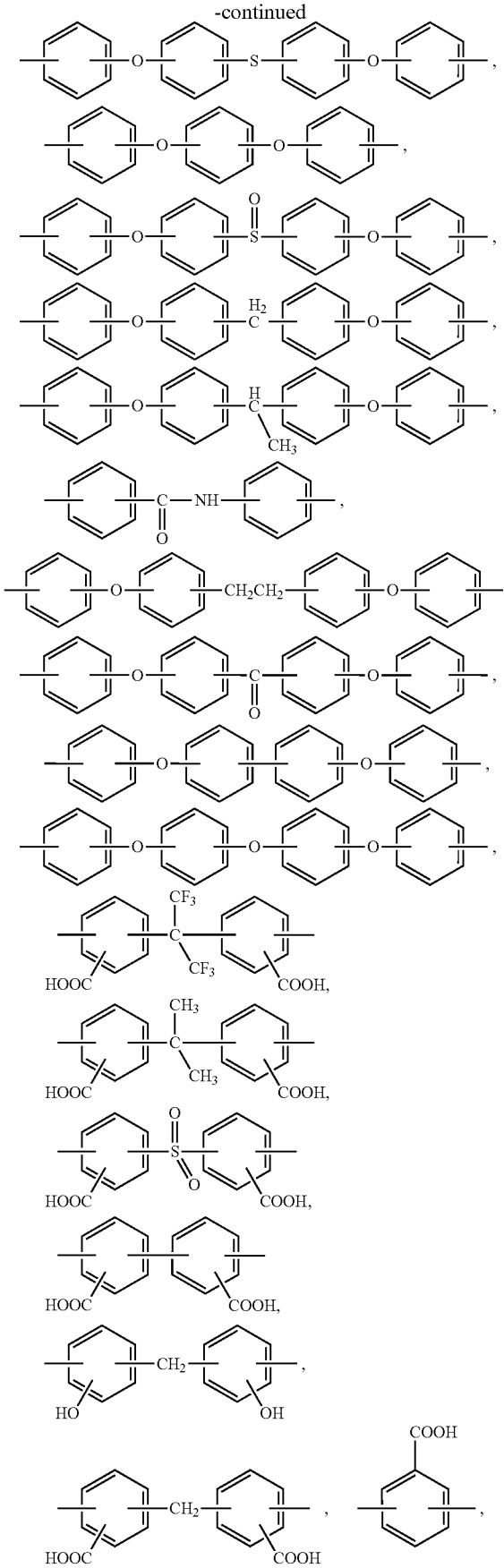
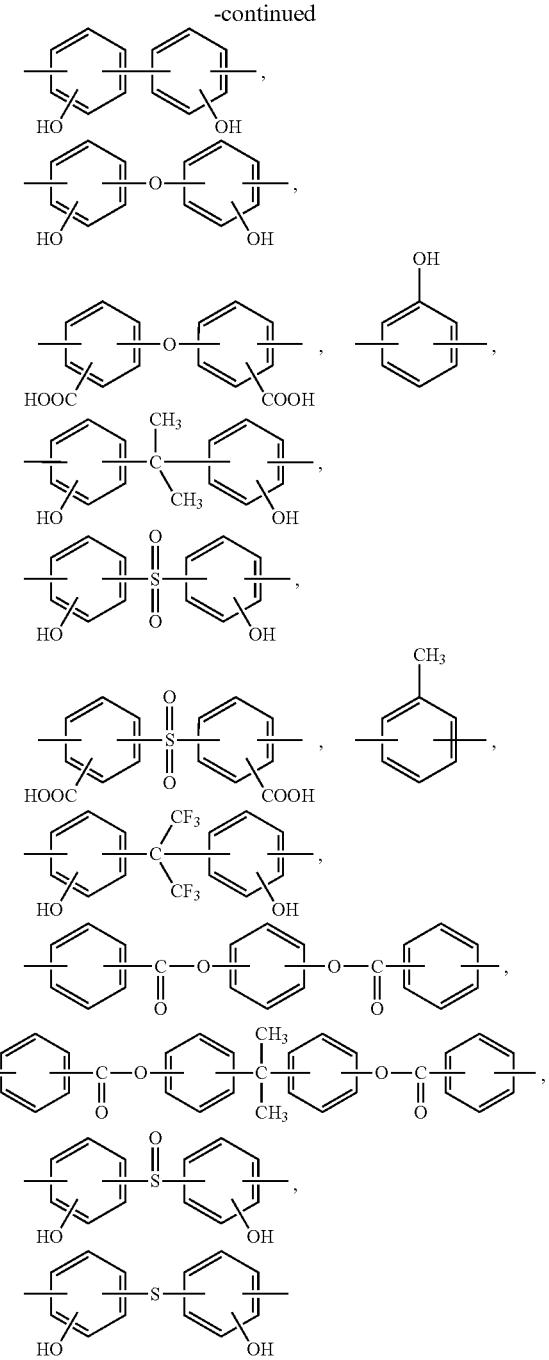

Where the number of moles of the diamine represented by General Formula (4) is 1, the diamine represented by General Formula (5) is preferably contained by not more than 1.0 mole, more preferably not more than 0.8 moles, especially preferably not more than 0.5 moles. This improves the imidized tetracarboxylic acid represented by General Formula (1) in its solubility in an organic solvent. In addition, the tetracarboxylic acid can be imidized at a low imidization temperature.

<Production Method of Imidized Tetracarboxylic Acid>

The aforementioned partially-imidized tetracarboxylic acid can be produced by various methods as mentioned below:

Method 1: A tetracarboxylic acid dianhydride represented by General Formula (3) is dispersed or dissolved in an organic solvent. Into a resultant solution, there is added a diamine represented by General Formula (4) or diamines represented by General Formulae (4) and (5), and a resultant mixture is reacted. Thus, a polyamide acid solution is prepared. At this time, the diamine(s) is/are added so that a total amount thereof is 0.20 to 0.80 moles relative to 1 mole of the tetracarboxylic acid dianhydride. After the reaction between the tetracarboxylic acid dianhydride and the diamine(s) is completed, an obtained polyamide acid solution is heated at not less than 100° C. but not more than 300° C., more preferably not less than 150° C. but not more than 250° C., so as to perform imidization.

Further, in order to open terminal anhydride rings, water is added to the polyimide resin solution, and a resultant solution is heated at not less than 40° C. but not more than 200° C., more preferably not less than 60° C. but not more than 150° C., so as to open carboxylic anhydrides at both terminals. Thus, a partially-imidized polyimide resin can be obtained. The solvent used in this method is preferably a solvent that can be heated to a glass transition temperature of the polyimide resin or higher, especially preferably a solvent that can be head to a temperature of at least 30° C. higher than the glass transition temperature.

Method 2: A tetracarboxylic acid dianhydride represented by General Formula (3) is dispersed or dissolved in an organic solvent. Into a resultant solution, there is added a diamine represented by General Formula (4) or diamines represented by General Formulae (4) and (5), and a resultant mixture is reacted. Thus, a polyamide acid solution is prepared. At this time, the diamine(s) is/are added so that a total amount thereof is 0.20 to 0.80 moles relative to 1 mole of the tetracarboxylic acid dianhydride. Into the polyamide acid solution, a catalyst for imidization (preferably a tertiary amine such as pyridine, picoline, isoquinoline, trimethylamine, triethylamine, or tributylamine) and a dehydrating agent (such as acetic anhydride) are added and heated to not less than 60° C. but not more than 180° C., so as to imidize the solution. Then, water is poured to the imidized solution, or the imidized solution is poured into water, thereby precipitating a resultant product in a form of solid. The precipitate is then filtered and dried to obtain an imidized tetracarboxylic acid.

Method 3: A tetracarboxylic acid dianhydride represented by General Formula (3) is dispersed or dissolved in an organic solvent. Into a resultant solution, there is added a diamine represented by General Formula (4) or diamines represented by General Formulae (4) and (5), and a resultant mixture is reacted. Thus, a polyamide acid solution is prepared. At this time, the diamine(s) is/are added so that a total amount thereof is 0.20 to 0.80 moles relative to 1 mole of the tetracarboxylic acid dianhydride. The polyamide acid solution is placed in a vacuum oven heated at not less than 100° C. but not more than 250° C., and air is evacuated while the polyamide acid solution is being heated and dried. Thus, the polyamide acid solution is imidized. An obtained imidized resin is then heated in water to open its terminal anhydride rings, thereby preparing a tetracarboxylic acid.

The methods described above are preferably employed, but the production method of a partially-imidized tetracarboxylic acid is not limited to them. Any method can be employed as long as an imidized tetracarboxylic acid in which terminal acid anhydride groups are opened and a center of the tetracarboxylic acid is imidized can be obtained.

The reaction of the tetracarboxylic acid dianhydride represented by General Formula (3) with either the diamine represented by General Formula (4) or the diamines represented by General Formulae (4) and (5) to prepare the imidized tetracarboxylic acid represented by General Formula (1) is carried out such that the diamine(s) is/are added preferably by 0.20 to 0.80 moles, more preferably 0.30 to 0.70 moles relative to 1 mole of the tetracarboxylic acid dianhydride. When the diamine(s) is/are controlled in the above range, it is possible to restrain the molecular weight of the imidized tetracarboxylic acid represented by General Formula (1) to be low, and to efficiently obtain the imidized tetracarboxylic acid that is highly soluble in an organic solvent.

Further, in order to completely open terminal acid dianhydride groups, in the final step in the production method of the imidized tetracarboxylic acid, water is added preferably by at least 1.5 times more, more preferably at least 2.0 times more than terminal tetracarboxylic acid anhydride groups. It is preferable that water be added as much as possible.

In order to open rings by adding water in the system, heating is more preferable. In order to open rings more efficiently, heating is carried out preferably at not less than 30° C. but not more than 150° C., more preferably at not less than 40° C. but not more than 120° C. In the above range, it is possible to open the terminal carboxylic acid anhydride group efficiently.

Examples of the solvent used for polymerization in the present invention encompass: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; phenol-based solvents such as phenol, o-, m-, or p-cresol, xylenol, halogenated phenol, and catechol; solvents of symmetric glycol diethers such as hexamethylphosphoramide, γ-butyrolactone, methyl monoglyme (1,2-dimethoxyethane), methyl diglyme (bis(2-methoxyethyl) ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl) ether); solvents of acetates such as γ-butyrolactone, N-methyl-2-pyrrolidone, methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. Further, hexane, acetone, toluene, xylene, or the like, which has a low boiling point may be also used in combination as needed.

Further, the polyimide precursor composition of the present invention may contain a tetracarboxylic acid represented by General Formula (6):

[Chem. 21]

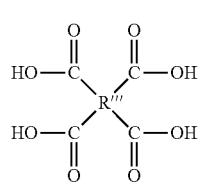

(6)

(wherein R''' represents a tetravalent organic group. Note that R''' does not have an imide ring).

The tetracarboxylic acid represented by General Formula (6) may be prepared in advance and then added to a polyimide precursor solution during preparation of the solution. Alternatively, during preparation of a solution of the partially-imidized tetracarboxylic acid represented by General Formula (1), an excessive amount of a tetracarboxylic acid dianhydride is added to the solution so as to prepare the tetracarboxylic acid represented by General Formula (6) at the same time. That is, in the course of production of the partially-imidized tetracarboxylic acid represented by General Formula (1), the diamine represented by General Formula (4) or the diamines represented by General Formulae (4) and (5) are reacted with the tetracarboxylic acid dianhydride represented by General Formula (3) such that a total amount of the diamine(s) is not more than 0.5 moles relative to 1 mole of the tetracarboxylic acid dianhydride. This results in that the tetracarboxylic acid represented by General Formula (6) coexists in the imidized tetracarboxylic acid that is finally prepared. Note that, depending on how the reaction proceeds, the tetracarboxylic acid represented by General Formula (6) may be produced even in a case where the diamine(s) is/are added by 0.5 moles or more.

As a specific example of the tetracarboxylic acid represented by General Formula (6), it is preferable to use 3,3',4,4'-benzophenone tetracarboxylic acid, pyromellitic acid, 3,3',4,4'-oxydiphthalic acid, 2,2-bis[4-(3,4-dicarboxyphenoxy)phenyl]propane, 2,2-bis(4-hydroxyphenyl)propane dibenzoate-3,3',4,4'-tetracarboxylic acid, 3,3',4,4 diphenyl sulfone tetracarboxylic acid, 3,3',4,4'-biphenyl tetracarboxylic acid, 2,3,3',4-biphenyl tetracarboxylic acid, or 5-(2,5-dioxotetrahydro-3-furanyl)-3-methyl-3-cyclohexene-1,2-dicarboxylic acid. In particular, it is preferable to use 2,2-bis[4-(3,4-dicarboxyphenoxy)phenyl]propane, 3,3',4,4'-diphenyl sulfone tetracarboxylic acid, 3,3',4,4'-oxydiphthalic acid, or 5-(2,5-dioxotetrahydro-3-furanyl)-3-methyl-3-cyclohexene-1,2-dicarboxylic acid. Note that R in General Formula (1) and R''' in General Formula (6) may be the same or different.

Especially, it is preferable to use 2,2-bis[4-(3,4-dicarboxyphenoxy)phenyl]propane, in order to decrease the viscosity of the solution and to decrease the final imidization temperature.

<Isocyanate Compound>

The isocyanate compound to be used in the present invention is a compound having two or more isocyanate groups.

Examples of the isocyanate compound encompass diisocyanates: for example, aromatic diisocyanates such as tolylenediisocyanate, xylylene diisocyanate, diphenylmethane diisocyanate, polymeric diphenylmethane diisocyanate, naphthalene diisocyanate, tolidine diisocyanate, and tetramethylxylene diisocyanate; alicyclic diisocyanates such as hydrogenated diphenylmethane diisocyanate, hydrogenated xylylene diisocyanate, isophorone diisocyanate, and norbornene diisocyanate; and aliphatic diisocyanates such as hexamethylene diisocyanate, trimethyl hexamethylene diisocyanate, and lysine diisocyanate. The isocyanate compounds that can be used especially preferably are aromatic diisocyanates such as tolylenediisocyanate, xylylene diisocyanate, diphenylmethane diisocyanate, polymeric diphenylmethane diisocyanate, naphthalene diisocyanate, tolidine diisocyanate, and tetramethylxylene diisocyanate.

The use of such an isocyanate compound is preferable because high heat resistance can be imparted to a cured coating film obtained by curing the polyimide precursor composition.

Furthermore, in the present invention, it is also possible to use a block isocyanate compound obtained by stabilizing the isocyanate compound with a blocking agent. The block isocyanate compound is a compound which is inactive at a room temperature but which, when heated, reproduces an isocyanate group due to dissociation of the blocking agent. Here, the blocking agent may be, for example, oximes, diketones, phenols, caprolactams, or the like. Examples of the block isocyanate compound encompass: DURANATE 17B-60PX, DURANATE TPA-B80E, DURANATE MF-B60X, DURANATE MF-K60X, and DURANATE E402-B80T, each of which is manufactured by Asahi Kasei Chemicals Corporation; TAKENATE B-830, TAKENATE B-815N, TAKENATE B-846N, and TAKENATE B-882N, each of which is manufactured by Mitsui Chemical Polyurethane, Inc.; and CORONATE AP-M, CORONATE 2503, CORONATE 2507, CORONATE 2513, CORONATE 2515, and MILLIONATE MS-50, each of which is manufactured by Nippon Polyurethane Industry Co., Ltd. The block isocyanate compounds to be particularly preferably used in the present invention may be, for example, hexamethylene diisocyanate-based isocyanurate type, biuret type, or adduct type block isocyanate compounds, hydrogenated diphenylmethane diisocyanate block isocyanate compounds, and hydrogenated xylylene diisocyanate block isocyanate compounds, each of which has a dissociation temperature of the blocking agent of not more than 160° C.

With the use of the block isocyanate compound, high adhesiveness to a based material can be imparted to a cured coating film obtained by curing the polyimide precursor composition. From this viewpoint, it is preferable to use the block isocyanate compound.

The isocyanate compounds can be used solely or two or more types of the isocyanate compounds can be used in combination.

<Diamine>

The diamine used in the present invention is a compound having two amino groups represented by the following General Formula (2):

[Chem. 22]

$$H_2N-R''-NH_2 \qquad (2)$$

(where R'' represents a divalent organic group).

In the present invention, the diamine that can be preferably used in combination with the isocyanate compound is preferably such a diamine in which R'' in General Formula (2) is a divalent organic group selected from General Formula Group (3):

[Chem. 23]

Group (3)

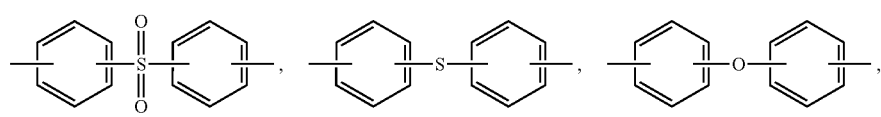

-continued
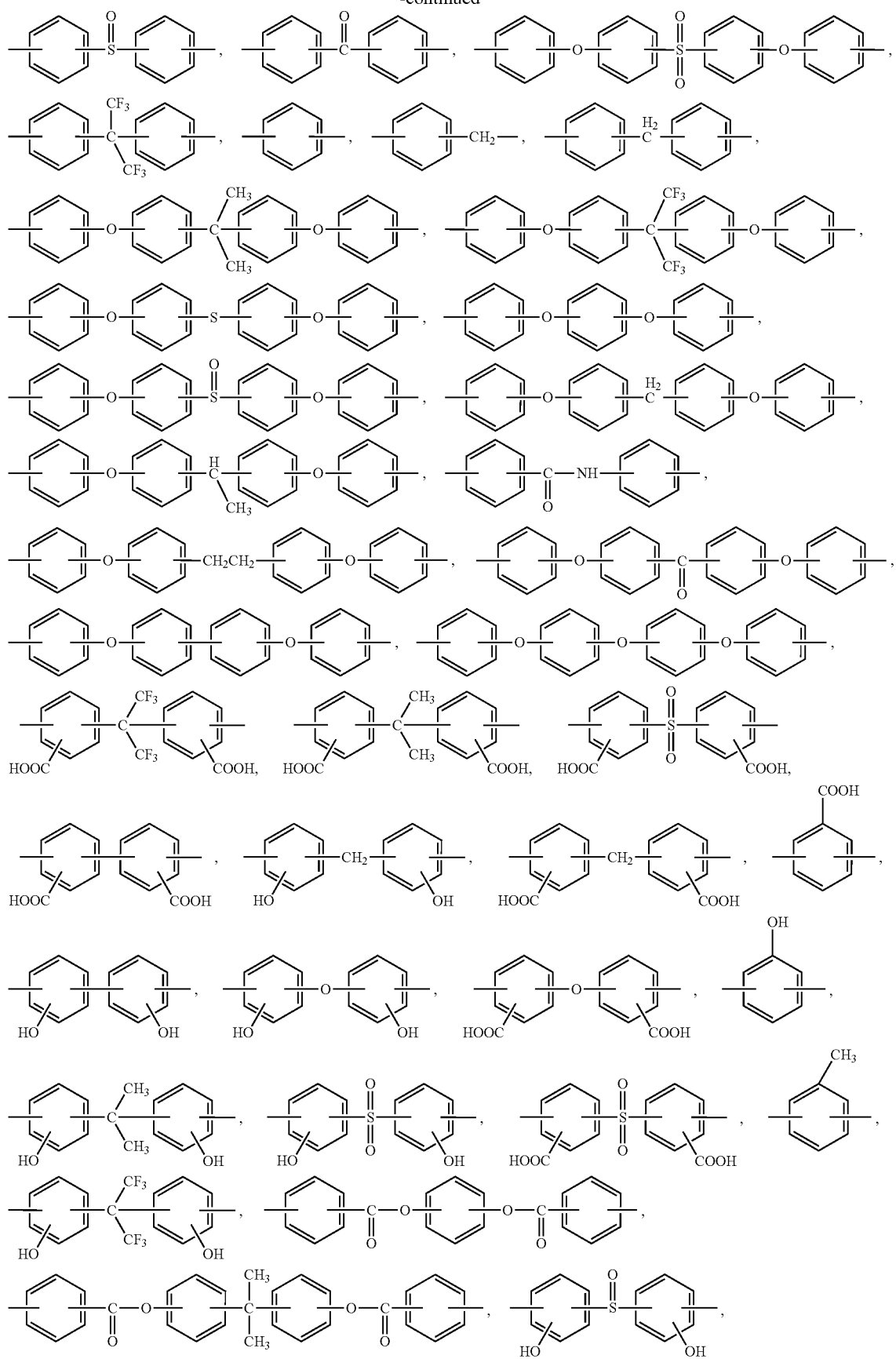

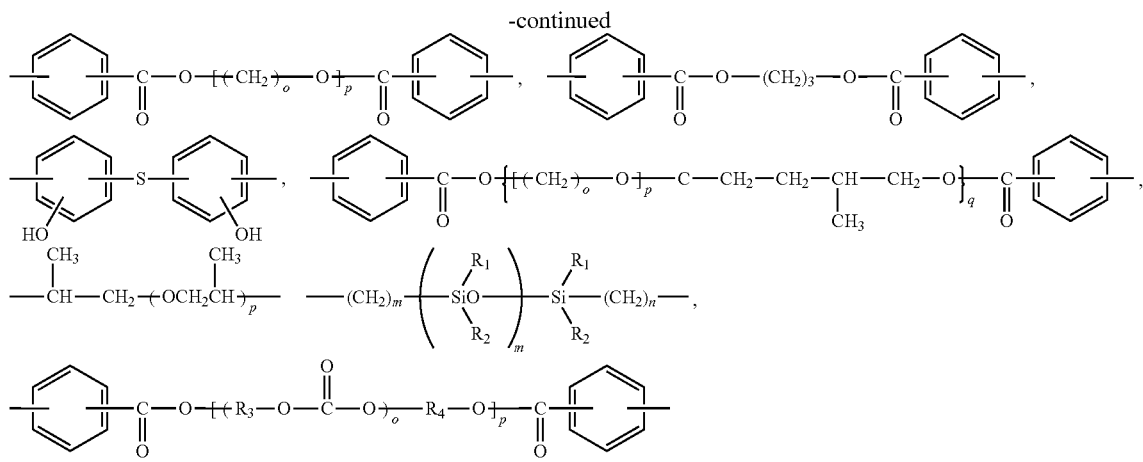

More specifically, examples of the diamino compound encompass: diamino phenols such as m-phenylenediamine, o-phenylenediamine, p-phenylenediamine, m-aminobenzylamine, p-aminobenzylamine, bis(3-aminophenyl)sulfide, (3-aminophenyl)(4-aminophenyl)sulfide, bis(4-aminophenyl)sulfide, bis(3-aminophenyl)sulfoxide, (3-aminophenyl)(4-aminophenyl)sulfoxide, bis(4-aminophenyl)sulfoxide, bis(3-aminophenyl)sulfone, (3-aminophenyl)(4-aminophenyl)sulfone, bis(4-aminophenyl)sulfone, 3-4'-diaminobenzophenone, 4,4'-diaminobenzophenone, 3,3'-diaminobenzophenone, 3,3'-diaminodiphenylmethane, 3,4'-diaminodiphenylmethane, 4,4'-diaminodiphenylmethane, 4,4'-diaminodiphenylether, 3,3'-diaminodiphenylether, 3,4'-diaminodiphenylether, bis[4-(3-aminophenoxy)phenyl]sulfoxide, bis[4-(4-aminophenoxy)phenyl]sulfoxide, (4-aminophenoxyphenyl)(3-aminophenoxyphenyl)phenyl]sulfoxide, bis[4-(3-aminophenoxy)phenyl]sulfone, bis[4-(aminophenoxy)phenyl]sulfone, (4-aminophenoxyphenyl)(3-aminophenoxyphenyl)phenyl]sulfone, bis[4-(3-aminophenoxy)phenyl]sulfide, bis[4-(aminophenoxy)phenyl]sulfide, (4-aminophenoxyphenyl)(3-aminophenoxyphenyl)phenyl]sulfide, 3,3'-diaminobenzanilide, 3,4'-diaminobenzanilide, 4,4'-diaminobenzanilide, bis[4-(3-aminophenoxy)phenyl]methane, bis[4-(4-aminophenoxy)phenyl]methane, [4-(4-aminophenoxyphenyl)][4-(3-aminophenoxyphenyl)]methane, 1,1-bis[4-(3-aminophenoxy)phenyl]ethane, 1,1-bis[4-(4-aminophenoxy)phenyl]ethane, 1,1-[4-(4-aminophenoxyphenyl)][4-(3-aminophenoxyphenyl]ethane, 1,2-bis[4-(3-aminophenoxy)phenyl]ethane, 1,2-bis[4-(4-aminophenoxy)phenyl]ethane, 1,2-[4-(4-aminophenoxyphenyl)][4-(3-aminophenoxyphenyl)]ethane, 2,2-bis[4-(3-aminophenoxy)phenyl]propane, 2,2-bis[4-(4-aminophenoxy)phenyl]propane, 2,2-[4-(4-aminophenoxyphenyl)][4-(3-aminophenoxyphenyl)]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 2,2-[4-(4-aminophenoxyphenyl)][4-(3-aminophenoxyphenyl)]-1,1,1,3,3,3-hexafluoropropane, 1,3-bis(3-aminophenoxy)benzene, 1,4-bis(3-aminophenoxy)benzene, 1,4-bis(4-aminophenoxy)benzene, 1,3-bis(4-aminophenoxy)benzene, 4,4'-bis(4-aminophenoxy)biphenyl, 4,4'-bis(3-aminophenoxy)biphenyl, bis[4-(3-aminophenoxy)phenyl]ketone, bis[4-(4-aminophenoxy)phenyl]ketone, bis[4-(4-aminophenoxy)phenyl]ether, bis[4-(4-aminophenoxy)phenyl]ether, polytetramethylene oxide-di-P-aminobenzoate, poly(tetramethylene/3-methyltetramethylene ether)glycol bis(4-aminobenzoate), trimethylene-bis(4-aminobenzoate), p-phenylene-bis(4-aminobenzoate), m-phenylene-bis(4-aminobenzoate), bisphenol A-bis(4-aminobenzoate), 2,4-diaminobenzoic acid, 2,5-diaminobenzoic acid, 3,5-diaminobenzoic acid, 3,3'-diamino-4,4'-dicarboxybiphenyl, 4,4'-diamino-3,3'-dicarboxybiphenyl, 4,4'-diamino-2,2'-dicarboxybiphenyl, [bis(4-amino-2-carboxy)phenyl]methane, [bis(4-amino-3-carboxy)phenyl]methane, [bis(3-amino-4-carboxy)phenyl]methane, [bis(3-amino-5-carboxy)phenyl]methane, 2,2-bis[3-amino-4-carboxyphenyl]propane, 2,2-bis[4-amino-3-carboxyphenyl]propane, 2,2-bis[3-amino-4-carboxyphenyl]hexafluoropropane, 2,2-bis [4-amino-3-carboxyphenyl]hexafluoropropane, 3,3'-diamino-4,4'-dicarboxydiphenyl ether, 4,4'-diamino-3,3'-dicarboxydiphenyl ether, 4,4'-diamino-2,2'-dicarboxydiphenyl ether, 3,3'-diamino-4,4'-dicarboxydiphenyl sulfone, 4,4'-diamino-3,3'-dicarboxydiphenyl sulfone, 4,4'-diamino-2,2'-dicarboxydiphenyl sulfone, 2,3-diaminophenol, 2,4-diaminophenol, 2,5-diaminophenol, and 3,5-diaminophenol; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2',5,5'-tetrahydroxybiphenyl; dihydroxydiphenylmethanes such as 3,3'-diamino-4,4'-dihydroxydiphenylmethane, 4,4'-diamino-3,3'-dihydroxydiphenylmethane, and 4,4'-diamino-2,2'-dihydroxydiphenylmethane; bis[hydroxyphenyl]propanes such as 2,2-bis[3-amino-4-hydroxyphenyl]propane and 2,2-bis[4-amino-3-hydroxyphenyl]propane; bis[hydroxyphenyl]hexafluoropropanes such as 2,2-bis[3-amino-4-hydroxyphenyl]hexafluoropropane and 2,2-bis[3-amino-4-hydroxyphenyl]hexafluoropropane; hydroxydiphenyl ethers such as 3,3'-diamino-4,4'-dihydroxydiphenyl ether, 4,4'-diamino-3,3'-dihydroxydiphenyl ether, and 4,4'-diamino-2,2'-dihydroxydiphenyl ether; dihydroxydiphenyl sulfones such as 3,3'-diamino-4,4'-dihydroxydiphenyl sulfone, 4,4'-diamino-3,3'-dihydroxydiphenyl sulfone, and 4,4'-diamino-2,2'-dihydroxydiphenyl sulfone; dihydroxydiphenyl sulfides such as 3,3'-diamino-4,4'-dihydroxydiphenyl sulfide, 4,4'-diamino-3,3'-dihydroxydiphenyl sulfide, and 4,4'-diamino-2,2'-dihydroxydiphenyl sulfide; dihydroxydiphenyl sulfoxides such as 3,3'-diamino-4,4'-dihydroxydiphenyl sulfoxide, 4,4'-diamino-3,3'-dihydroxydiphenyl sulfoxide, and 4,4'-diamino-2,2'-dihydroxydiphenyl sulfoxide; bis[(hydroxyphenyl)phenyl]alkane compounds such as 2,2-bis[4-(4-amino-3-hydroxyphenoxy)phenyl]propane; bis(hydroxyphenoxy)biphenyl compounds such as 4,4'-bis(4-amino-3-hydroxyphenoxy)biphenyl; bis

[(hydroxyphenoxy)phenyl]sulfone compounds such as 2,2-bis[4-(4-amino-3-hydroxyphenoxy)phenyl]sulfone; and bis(hydroxyphenoxy)biphenyl compounds such as 4,4'-diamino-3,3'-dihydroxydiphenylmethane, 4,4'-diamino-2,2 dihydroxydiphenylmethane, 2,2-bis[3-amino-4-carboxyphenyl]propane, and 4,4'-bis(4-amino-3-hydroxyphenoxy)biphenyl.

In order to improve heat resistance of a coating film of a polyimide resin prepared by use of an obtained polyimide precursor composition, it is preferable that a glass transition temperature of a material to be used be not less than 50° C. As such a material, it is preferable to use p-phenylenediamine, bis(3-aminophenyl)sulfone, bis(4-aminophenyl)sulfone, 3,3'-diaminodiphenylmethane, 4,4'-diaminodiphenylmethane, 4,4'-diaminodiphenylether, 3,3'-diaminodiphenylether, bis[4-(3-aminophenoxy)phenyl]sulfone, bis[4-(4-aminophenoxy)phenyl]sulfone, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis(3-aminophenoxy)benzene, 1,4-bis(3-aminophenoxy)benzene, 1,4-bis(4-aminophenoxy)benzene, 1,3-bis(4-aminophenoxy)benzene, bis[4-(3-aminophenoxy)phenyl]ether, bis[4-(4-aminophenoxy)phenyl]ether, polytetramethylene oxide-di-P-aminobenzoate, poly(tetramethylene/3-methyltetramethylene ether)glycol bis(4-aminobenzoate), trimethylene-bis(4-aminobenzoate), p-phenylene-bis(4-aminobenzoate), m-phenylene-bis(4-aminobenzoate), bisphenol A-bis(4-aminobenzoate), 3,5-diaminobenzoic acid, [bis(4-amino-2-carboxy)phenyl]methane, [bis(4-amino-3-carboxy)phenyl]methane, [bis(3-amino-4-carboxy)phenyl]methane, [bis(3-amino-5-carboxy)phenyl]methane, or 2,2-bis[3-amino-4-carboxyphenyl]propane.

With the use of the diamine exemplified above, high heat resistance can be imparted to a cured coating film obtained by curing the polyimide precursor composition. Therefore, the use of the diamine exemplified above is preferable.

In the production of the polyimide precursor composition of the present invention, the isocyanate compound is added such that a total amount of the isocyanate compound and diamine(s) present in a finally-prepared polyimide precursor composition is 0.70 to 1.30 moles, more preferably 0.80 to 1.10 moles, especially preferably 0.90 to 1.10 moles, relative to 1 mole of the tetracarboxylic acid dianhydride used to produce the imidized tetracarboxylic acid represented by General Formula (1). Here, the diamine(s) present in the finally-prepared polyimide precursor composition means: (a) the diamine represented by General Formula (4); (b) the diamines represented by General Formulae (4) and (5); or (c) the diamines represented by General Formulae (4), (5), and further (2) in a case where the diamine represented by General Formula (2) is also used. By controlling the addition amount of the isocyanate compound within the above range, the imidization reaction easily proceeds when the imidization is carried out by heating, and a polyimide resin having a high molecular weight can be easily obtained. For this reason, the above range of the addition amount of the isocyanate compound is preferable. A temperature at the time when the isocyanate compound is added is not especially limited as long as the temperature does not cause imidization. In view of this, the isocyanate compound is mixed at preferably not more than 100° C., more preferably not more than 80° C.

<Method for Preparing Polyimide Precursor Composition Solution>

The following describes how to prepare a polyimide precursor composition solution of the present invention. In a case where the polyimide precursor composition solution is prepared in a solution in which an imidized tetracarboxylic acid is synthesized, it is preferable that the solution be directly used without further treatment such that an isocyanate compound is added to the solution so as to prepare the polyimide precursor composition solution. In a case where a polyimide precursor composition is once separated as a solid, it is preferable to dilute the polyimide precursor composition with a solvent when it is used.

It is preferable that the solvents exemplified above as the solvent for used in the polymerization be used solely, or two or more types thereof be used in combination.

In preparation of the polyimide precursor solution, the solute concentration thereof is preferably 40 to 90% by weight, more preferably 45 to 85% by weight, as a concentration of the polyimide precursor composition solution.

The solute concentration in the present invention indicates a value calculated by the following Expression (1):

$$\text{Solute concentration (\%)}=\text{Solute weight}/(\text{Solute weight}+\text{Solvent weight})\times 100 \quad \text{Expression (1)}$$

The solute weight and the solvent weight in the expression are as follows: the solute weight is a weight of raw materials other than an organic solvent, which raw materials are dissolved in the organic solvent. For example, a certain amount (A gram) of a resin solution is taken out, and the resin solution is heated to at least a temperature at which the solvent can be volatilized. Then, a weight (B gram) of a residual solid content is measured. The weight (B gram) of the solid content thus measured is the solute weight. Accordingly, the solvent weight is a value calculated according to the following Expression (2):

$$\text{Solvent weight}=A-B \quad \text{Expression (2)}$$

In the present invention, the concentration of the solution in which the polyimide precursor composition is dissolved is preferably 40 to 90% by weight, more preferably 45 to 85% by weight, as described above. When the solution concentration is within the above range, an amount of the solvent to be removed is reduced, and therefore the handleability is improved in producing a shaped product by use of the polyimide resin composition. Moreover, in the above range, when the polyimide precursor composition solution is formed into a film product, a change amount in thickness between an applied film of the polyimide precursor composition solution and a resultant dried film is decreased, thereby significantly improving the formability of the solution. Further, the above range of the solution concentration is preferable because the viscosity of the polyimide precursor composition solution can be controlled within an optimal range. For example, in a case where the polyimide precursor composition solution is applied and dried to form a film-shaped product, the viscosity is generally preferably 6000 poise or less, more preferably 5000 poise or less at 23° C., though it depends on the application method. In some cases, the application of the solution may be difficult when the viscosity is more than 6000 poise. In the case of the present invention, by adjusting the concentration, it is possible to freely control the viscosity from a high viscosity to a low viscosity.

Into the polyimide precursor solution of the present invention, well-known additives can be optionally added if necessary, as long as the advantageous effects of the present invention are not impaired. The well-known additives may be, for example, fillers such as organic silanes, pigments, conductive carbon black, and metal particles; abrasion agents; dielectrics; lubricants, and the like. Further, it is also possible to add, to the polyimide precursor solution, other polymers and solvents such as water-insoluble ethers, alcohols, ketones, esters, halogenated hydrocarbons, and hydrocarbons, as long as the advantageous effect of the present invention are not impaired.

A polyimide coating film is prepared such that: the polyimide precursor composition solution is applied on a base material by a well-known method such as a spin-coating method, a spray-coating method, a screen-printing method, a soaking method, a curtain-coating method, a dip-coating method, and a die-coating method. A resultant applied film is then dried at a temperature of not more than 250° C. to remove a solvent. A resultant dried film is then imidized.

The polyimide precursor composition of the present invention requires a low temperature for imidization, and is curable at not more than 250° C. Curing at low temperatures is preferable because when the polyimide precursor composition is applied on a printed wiring board, for example, a copper foil, which is an electrical conductor, is not degraded by oxidation. In view of this, the curing temperature is particularly preferably not more than 200° C. The polyimide precursor composition of the present invention is also curable at such a low temperature of not more than 200° C.

<Photosensitive Resin Composition>

One example of the use of the polyimide precursor composition of the present invention is a photosensitive resin composition. The following describes the photosensitive resin composition, more specifically. Needless to say, examples of the use of the polyimide precursor composition of the present invention are not limited to the description. The photosensitive resin composition is constituted as follows. That is, the photosensitive resin composition contains the aforementioned polyimide precursor composition, at least a photosensitive resin, and a photopolymerization initiator. As for the polyimide precursor composition used in the photosensitive resin composition, any of the polyimide precursor compositions described above can be used without any particular limitation. In the polyimide precursor composition, as for the imidized tetracarboxylic acid, a tetracarboxylic-acid-terminated siloxane imide oligomer obtained by use of silicon diamine (siloxane diamine) is preferably used, but the imidized tetracarboxylic acid is not limited to this.

The following describes each of the constituent materials, more specifically.

<Photosensitive Resin>

The photosensitive resin in the present invention is a monomer, an oligomer or a polymer resin that is polymerized by a radical, an acid, a base, a proton, an amine, or the like generated by light or heat. More preferably, the photosensitive resin is a resin having at least one unsaturated double bond. Moreover, the unsaturated double bond is preferably an acrylic group ($CH_2$=CH— group), a methacryloyl group ($CH_2$=C($CH_3$)— group), or a vinyl group (—CH=CH— group). The following exemplifies photosensitive resins preferably used in the present invention. However, any resin can be used as long as the resin has at least one unsaturated double bond described above.

Examples of the photosensitive resin preferably used in the present invention encompass, for example: bisphenol F EO-denatured (n=2 to 50) diacrylate, bisphenol A EO-denatured (n=2 to 50) diacrylate, bisphenol S EO-denatured (n=2 to 50) diacrylate, bisphenol F EO-denatured (n=2 to 50) dimethacrylate, bisphenol A EO-denatured (n=2 to 50) dimethacrylate, bisphenol S EO-denatured (n=2 to 50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacyrlate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxy diethylene glycol methacrylate, methoxy polyethylene glycol methacrylate, β-methacryloyloxyethyl hydrogen phthalate, β-methacryloyloxyethyl hydrogen succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxypropane, 2,2-bis[4-(methacryloxyethoxy)phenyl]propane, 2,2-bis[4-(methacryloxy diethoxy)phenyl]propane, 2,2-bis[4-(methacryloxy polyethoxy)phenyl]propane, polyethylene glycol diacrylate, tripropylene glycol diacrylate, polypropylene glycol diacrylate, 2,2-bis[4-(acryloxy diethoxy)phenyl]propane, 2,2-bis[4-(acryloxy polyethoxy)phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylenealkyl ether acrylate, nonylphenoxyethylene glycol acrylate, polypropylene glycol dimethacrylate, 1,4-butanediol dimethacrylate, 3-methyl-1,5-pentanediol dimethacrylate, 1,6-mexanediol dimethacrylate, 1,9-nonanediol methacrylate, 2,4-diethyl-1,5-pentanediol dimethacrylate, 1,4-cyclohexane dimethanol dimethacrylate, dipropylene glycol diacrylate, tricyclodecane dimethanol diacrylate, 2,2-hydrogenated bis[4-(acryloxy polyethoxy)phenyl]propane, 2,2-bis[4-(acryloxy polypropoxy)phenyl]propane, 2,4-diethyl-1,5-pentanediol diacrylate, ethoxylated trimethylolpropane triacrylate, propoxylated trimethylolpropane triacrylate, isocyanuric acid tri (ethane acrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, glycidyl allyl ether, 1,3,5-triacryloylhexahydro-s-triazine, triallyl 1,3-5-benzenecarboxylate, triallylamine, triallyl citrate, triallyl phosphate, allobarbital, diallylamine, diallyl dimethyl silane, diallyl disulfide, diallyl ether, diallyl cyanurate, diallyl isophthalate, diallyl terephthalate, 1,3-diallyloxy-2-propanol, diallyl sulfide diallyl maleate, 4,4'-isopropylidene diphenol dimethacrylate, 4,4'-isopropylidene diphenol diacrylate, and the like. However, the photosensitive resin preferably used in the present invention is not limited to the above examples. Especially, a diacrylate or methacrylate having 2 to 50 repeating units of EO (ethylene oxide) per molecule is preferable, and a diacrylate or methacrylate having 2 to 40 repeating units of EO per molecule is more preferable. When the diacrylate or methacrylate having 2 to 50 repeating units of EO is used, solubility in an aqueous developing solution, which is typically represented by an alkaline aqueous solution, is improved, and the developing time is reduced. In addition to that, stress does not easily remain in a cured film prepared by curing the photosensitive resin composition. For example, when the photosensitive resin composition is laminated on a flexible printed wiring board (as one example of printed wiring boards) which includes a polyimide resin as a base material, curling of the printed wiring board can be restrained.

In addition to the above examples, compounds having a hydroxyl group and/or a carbonyl group in a molecular structural skeleton, such as 2-hydroxy-3-phenoxypropyl acrylate, phthalic acid monohydroxyethyl acrylate, ε-carboxy-polycaprolactone monoacrylate, acrylic acid dimer, pentaerythritol triacrylate, and pentaerythritol tetraacrylate are also preferably used.

Further, any other photosensitive resin, for example, epoxy-denatured acrylic (methacrylic) resins, urethane-denatured acrylic (methacrylic) resins, and polyester-denatured acrylic (methacrylic) resins, can be also used.

The photosensitive resin may be used solely. However, it is preferable to use two or more types of the photosensitive resins in combination, from the viewpoint of improving heat resistance of a cured film obtained after photo-curing.

<Photopolymerization Initiator>

As the photopolymerization initiator, a photopolymerization initiator having any structure can be used as long as the photopolymerization initiator generates a radical, an acid, a base, a proton, an amine, or the like upon light irradiation. Examples of the photopolymerization initiator encompass Michler's ketone, 4,4'-bis(diethylamino)benzophenone, 4,4',4''-tris(dimethylamino)triphenylmethane, 2,2'-bis(2-chlorophenyl)-4,4',5,5'-tetraphenyl-1,2'-diimidazole, acetophenone, benzoin, 2-methylbenzoin, benzoin methyl ether, benzoin ethyl ether, benzoin isopropyl ether, benzoin isobutyl ether, 2-t-butylanthraquinone, 1,2-benzo-9,10-anthraquinone, methylanthraquinone, thioxanthone, 2,4-diethylthioxanthone, 2-isopropylthioxanthone, 1-hydroxycyclohexyl phenyl ketone, diacetylbenzyl, benzyl dimethyl ketal, benzyl diethyl ketal, 2(2'-furilethylidene)-4,6-bis(trichloromethyl)-S-triazine, 2[2'(5''-methylfuril)ethylidene]-4,6-bis(trichloromethyl)-S-triazine, 2(p-methoxyphenyl)-4,6-bis(trichloromethyl)-S-triazine, 2,6-di(p-azidobenzal)-4-methylcyclohexanone, 4,4'-diazidochalcon, di(tetraalkylammonium)-4,4'-diazidostilbene-2,2'-disulfonate, 2,2-dimethoxy-1,2-diphenylethane-1-one, 1-hydroxy-cyclohexyl-phenyl-ketone, 2-hydroxy-2-methyl-1-phenyl-propane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, 2-benzyl-2-dimethylamino-1-(4-morpholinophenyl)-butane-1-one, bis(2,4,6-trimethylbenzoyl)-phenylphosphine oxide, bis(2,6-dimethoxybenzoyl)-2,4,4-trimethyl-pentylphosphine oxide, 2,4,6-trimethylbenzoyl-diphenyl-phosphine oxide, 2-hydroxy-2-methyl-1-phenyl-propane-1-ketone, bis(n5-2,4-cyclopentadiene-1-yl)-bis(2,6-difluoro-3-(1H-pyrrole-1-yl)-phenyl)titanium, 1,2-octanonedione, 1-[4-(phenylthio)-2-(O-benzoyloxime)], iodonium, (4-methylphenyl)[4-(2-methylpropyl)phenyl]-hexafluorophosphate(1-), ethyl-4-dimethylaminobenzoate, 2-ethylhexyl-4-dimethylaminobenzoate, ethanone, and 1-[9-ethyl-6-(2-methylbenzoyl)-9H-carbazol-3-yl]-1-(O-acetyloxime). It is preferable that the photopolymerization initiator be selected as appropriate. Further, it is preferable that one or more of the photopolymerization initiators be used in combination.

The polyimide precursor composition, the photosensitive resin, and the photopolymerization initiator are mixed in the photosensitive resin composition of the present invention preferably such that, relative to 100 parts by weight of a solid content of the polyimide precursor composition, the photosensitive resin is contained by 10 to 200 parts by weight and the photopolymerization initiator is contained by 0.1 to 50 parts by weight.

By controlling the mixing ratio of these components as such, it is possible to improve various properties (electrical insulating reliability and the like) of a cured product or insulation film, which is obtained finally. Therefore, the mixing ratio described above is preferable.

In a case where the amount of the photosensitive resin is less than the above range, heat resistance of a cured coating film that is obtained by photo-curing of the photosensitive resin is decreased, and the contrast of the cured coating film after exposure and development tends to be decreased. In contrast, when the photosensitive resin is contained in the above range, it is possible to control the resolution in the exposure and development within an optimum range.

In a case where the amount of the photopolymerization initiator is less than the above range, a curing reaction of the photosensitive resin during light irradiation does not easily occur, thereby causing the photosensitive resin to be cured insufficiently in some cases. On the other hand, in a case where the amount of the photopolymerization initiator is larger than the above range, it is difficult to adjust the amount of light irradiation. This may cause the photosensitive resin to be overexposed in some cases. In view of this, in order to promote a photo-curing reaction efficiently, it is preferable to adjust the photopolymerization initiator within the above range.

<Thermosetting Resin>

The photosensitive resin composition of the present invention preferably contains a thermosetting resin so that the photosensitive resin composition has excellent heat resistance (solder heat resistance and the like) after curing, excellent chemical resistance (resistance to alkali solution, acid resistance, solvent resistance, and the like), excellent stability in resistance to wet environment, and excellent stability in resistance to heat environment.

Examples of the thermosetting resin to be used in the photosensitive resin composition of the present invention encompass: thermosetting resins such as epoxy resin, isocyanate resin, block isocyanate resin, bismaleimide resin, bisallylnadiimide resin, acrylic resin, methacrylic resin, curable hydrosilyl resin, curable allyl resin, and unsaturated polyester resin; and side-chain reactive group type thermosetting polymers having a reactive group such as an allyl group, a vinyl group, an alkoxysilyl group, or a hydrosilyl group provided on a side chain or a terminal of its polymer chain. Only one type of the thermosetting components may be used solely, or at least two types of the thermosetting components may be used in combination, as appropriate.

Among these thermosetting resins, epoxy resin is preferably used as the thermosetting resin. When a thermosetting resin composition contains an epoxy resin component, a cured resin obtained by curing the thermosetting resin composition can have heat resistance (solder heat resistance or the like), chemical resistance (resistance to alkali solution, acid resistance, solvent resistance and the like), stability in resistance to wet environment, and stability in resistance to heat environment. Moreover, the including of the epoxy resin component can render, to the cured resin, adhesiveness to a circuit board and a conductor such as a metal foil.

The epoxy resin is not especially limited in any particular structure, provided that the epoxy resin has at least two epoxy groups in a molecule. Examples of such an epoxy resin are epoxy resins such as bisphenol A type epoxy resin, bisphenol AD type epoxy resin, bisphenol S type epoxy resin, bisphenol F type epoxy resin, bisphenol A novolac type epoxy resin, hydrogenated bisphenol A type epoxy resin, ethylene oxide added bisphenol A type epoxy resin, propylene oxide added bisphenol A type epoxy resin, novolac type epoxy resin, glycidyl ester type epoxy resin, biphenyl type epoxy resin, phenol novolac type epoxy resin, alkylphenol novolac type epoxy resin, polyglycol type epoxy resin, cycloaliphatic epoxy resin, cyclopentadiene type epoxy resin, dicyclopentadiene type epoxy resin, cresol novolac type epoxy resin, glycidylamine type epoxy resin, naphthalene type epoxy resin, urethane-denatured epoxy resin, rubber-denatured epoxy resin, and epoxy-denatured polysiloxane. These epoxy resins may be used solely or at least two types of the epoxy resins may be used in combination by an appropriate ratio.

Examples of the epoxy resin encompass: naphthalene type tetra-functional epoxy resin EPICLON HP-4700 (trade name), cyclopentadiene type epoxy resin EPICLON HP-7200 (trade name), phenol novolac type epoxy resin EPICLON N-740 (trade name); highly-heat-resistant epoxy resin EPICLON EXA-7240 (trade name), cresol novolac type multifunctional epoxy resins EPICLON N-660, N-665, N-670, N-680, and N-655-EXP (trade name), phenol novolac type epoxy resin EPICLON N-740 (trade name), tetraphenylethane type epoxy resin EPICLON ETePE (trade name), and triphenylmethane type epoxy resin EPICLON ETrPM (trade name), all of which are manufactured by Dainippon Ink and Chemicals Inc.; bisphenol A type epoxy resin EPICOAT 828 etc. (trade name) manufactured by Japan Epoxy Resins Co., Ltd.; bisphenol F type epoxy resins YDF-170 etc. (trade name) manufactured by Tohto Kasei Co., Ltd.); phenol novolac type epoxy resins, such as EPICOAT 152 and 154 (trade name) manufactured by Japan Epoxy Resins Co., Ltd., EPPN-201 (trade name) manufactured by Nippon Kayaku Co., Ltd., and DEN-438 (trade name) manufactured by The Dow Chemical Company; o-cresol novolac type epoxy resins such as EOCN-125S, 103S, and 104S (trade name), manufactured by Nippon Kayaku Co., Ltd.; multifunctional epoxy resins, such as Epon 1031S (trade name) manufactured by Japan Epoxy Resins Co., Ltd., Araldite 0163 (trade name) manufactured by CIBA Specialty Chemicals Inc., DENACOL EX-611, EX-614, EX-614B, EX-622, EX-512, EX-521, EX-421, EX-411, and EX-321 (trade name) manufactured by Nagase chemicals Co, Ltd.; amine type epoxy resins, such as EPICOAT 604 (trade name) manufactured by Japan Epoxy Resins Co., Ltd., YH434 (trade name) manufactured by Tohto Kasei Co., Ltd., TETRAD-X and TERRAD-C (trade name) manufactured by Mitsubishi Gas Chemical Company, Inc., GAN (trade name) manufactured by Nippon Kayaku Co., Ltd., and ELM-120 (trade name) manufactured by Sumitomo Chemical Co., Ltd.; heterocycle-containing epoxy resins such as Araldite PT810 etc. (trade name) manufactured by CIBA Specialty Chemicals Inc.; and cycloaliphatic epoxy resins such as ERL 4234, 4299, 4221, and 4206 (trade name) manufactured by UCC. The epoxy resins can be used solely, or two or more types thereof can be used in combination.

The amount of the thermosetting resin to be used in the present invention is preferably 0.5 to 100 parts by weight relative to 100 parts by weight of a total solid content of the polyimide precursor composition, the photosensitive resin, and the photopolymerization initiator. The amount of the thermosetting resin is further preferably 1.0 to 50 parts by weight, particularly preferably 1.0 to 10 parts by weight. Mixing of the thermosetting resin in the photosensitive resin composition within the above range is preferable because it is possible to improve heat resistance, chemical resistance, and electrical insulating reliability of a cured film of the photosensitive resin composition. Further, controlling the mixing amount in the above range is preferable because flexibility can be rendered to a cured product obtained by curing the photosensitive resin composition.

Further, in the epoxy resin used in the photosensitive resin composition of the present invention, an epoxy compound that has just one epoxy group in one molecule can be also used in combination, in addition to the above exemplified epoxy resins. Examples of such an epoxy compound encompass: n-butyl glycidyl ether, phenyl glycidyl ether, dibromophenyl glycidyl ether, and dibromocresyl glycidyl ether. In addition to that, cycloaliphatic epoxy compounds such as 3,4-epoxycyclohexyl and methyl(3,4-epoxycyclohexane)carboxylate can be also used as the epoxy compound.

Further, into the photosensitive resin composition of the present invention, a curing agent for curing the thermosetting resin may be added, such as a compound having a phenolic hydroxyl group, a compound having an amine group, a compound having a carboxylic acid, a compound having a mercapto group, or a compound having an isocyanate group, for example. More specifically, the following compounds can be used together as the curing agent, for example: phenolic resins such as phenol novolac type phenolic resin, cresol novolac type phenolic resin, and naphthalene type phenolic resin; amino resins; urea resins; melamine resins; dicyandiamide; dihydrazine compounds; imidazole compounds; Lewis acid, salts; Broensted acid salts; polymercaptan compounds; and isocyanate and block isocyanate compounds.

Moreover, a curing accelerator for the thermosetting resin is not especially limited. Examples of the curing accelerator encompass: phosphine-based compounds such as triphenylphosphine; amine-based compounds such as tertiary amine, trimethanolamine, triethanolamine, and tetraethanolamine; borate-based compounds such as 1,8-diaza-bicyclo[5,4,0]-7-undecenium tetraphenylborate; imidazoles such as imidazole, 2-ethyl imidazole, 2-ethyl-4-methyl imidazole, 2-phenyl imidazole, 2-undecyl imidazole, 1-benzyl-2-methyl imidazole, 2-heptadecylimidazole, 2-isopropyl imidazole, 2,4-dimethyl imidazole, and 2-phenyl-4-methyl imidazole; imidazolines such as 2-methyl imidazoline, 2-ethyl imidazoline, 2-isopropyl imidazoline, 2-phenyl imidazoline, 2-undecylimidazoline, 2,4-dimethyl imidazoline, and 2-phenyl-4-methyl imidazoline; azine-based imidazoles such as 2,4-diamino-6-[2'-methylimidazolyl-(1')]-ethyl-s-triazine, 2,4-diamino-6-[2'-undecylimidazolyl-(1')]ethyl-s-triazine, and 2,4-diamino-6-[2'-ethyl-4'-methylimidazolyl-(1')]-ethyl-s-triazine. In a case where urethane resin has an amino group, the photosensitive resin composition is improved in property of being embedded into a circuit. In view of this, among the above curing accelerators, it is preferable to use the imidazoles such as 2-ethyl-4-methyl imidazole, 2-phenyl-4-methyl imidazole, and 2,4-diamino-6-[2'-undecylimidazolyl-(1')]-ethyl-s-triazine.

<Other Components>

The photosensitive resin composition of the present invention can further contain various additives, if necessary, such as a flame retardant, a defoaming agent, a coupling agent, a filler, an adhesive auxiliary agent, a leveling agent, and a polymerization inhibitor. As the filler, a fine inorganic filler such as silica, mica, talc, barium sulfate, wollastonite, or calcium carbonate; and a fine organic polymer filler may be contained. It is preferable to determine an amount of the additive to be contained, as appropriate.

<Photosensitive Resin Composition Solution>

The photosensitive resin composition of the present invention is used preferably as a photosensitive resin composition solution in which the photosensitive resin is dissolved in an organic solvent, in view of handleability. The photosensitive resin composition of the present invention is highly soluble in various organic solvents. Examples of the organic solvents encompass: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; phenol-based solvents such as phenol, o-, m-, or p-cresol, xylenol, halogenated phenol, and catechol; solvents of symmetric glycol diethers such as hexamethylphosphoramide, γ-butyrolactone, methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as γ-butyrolactone, N-methyl-2-pyrrolidone, methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. Note that hexane, acetone, toluene, xylene or the like, each of which has a low boiling point, may be used if necessary, to prepare the photosensitive resin composition solution.

Among these solvents, the solvents of the symmetric glycol diethers are particularly preferable because the photosensitive resin composition is highly soluble therein.

The photosensitive resin composition solution of the present invention contains the organic solvent preferably by not less than 10 parts by weigh but not more than 100 parts by weight relative to 100 parts by weight of an entire solid content of the photosensitive resin composition.

The photosensitive resin composition solution prepared in the above range is preferable because a rate of reduction in film thickness after drying is small.

<Method for Producing Photosensitive Resin Composition>

The photosensitive resin composition of the present invention is obtained by uniformly mixing the aforementioned various raw materials to be contained in the photosensitive resin composition. The uniform mixing of the raw materials may be carried out by use of an ordinary kneading machine such as a triple-roll mill or a beads mill device. In a case where the viscosity of a solution of the photosensitive resin composition is low, the mixing of the raw materials may be carried out by use of an ordinary stirring device.

<Use of Photosensitive Resin Composition>

The photosensitive resin composition of the present invention can be patterned as follows directly or after the photosensitive resin composition solution is prepared. Initially, the photosensitive resin composition is applied to a substrate and then dried so as to remove an organic solvent. The application of the photosensitive resin composition to the substrate may be carried out by screen printing, curtain rolling, reverse rolling, spray coating, rotational application by use of a spinner, or the like. An obtained applied film (having a thickness of preferably 5 to 100 μm, especially preferably 10 to 100 μm) is dried at not more than 120° C., preferably at 40 to 100° C. After the applied film is dried, a negative photomask is placed on the applied film thus dried, and the applied film is irradiated with active light such as ultraviolet rays, visible rays, electron beams, or the like. Then, a portion, in the applied film, that is not exposed to light is washed with a developing solution by a method such as a shower method, a paddle method, a soaking method, an ultrasonic method, or the like method so as to form a relief pattern. Since the time required for the pattern to be exposed differs depending on (i) spray pressure and flow speed of the developing device and (ii) a temperature of an etchant, it is preferable to find an optimum condition for the device as appropriate.

As the developing solution, an alkaline aqueous solution is preferably used. The developing solution may contain a water-soluble organic solvent such as methanol, ethanol, n-propanol, isopropanol, or N-methyl-2-pyrrolidone. Examples of alkaline compounds used for preparing the alkaline aqueous solution encompass hydroxides, carbonates, hydrogencarbonates, or amine compounds of alkaline metals, alkaline earth metals, or ammonium ion, for example. More specifically, examples of the alkaline compounds encompass sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, triisopropylamine, and the like. Further, any other compounds are obviously usable as long as the aqueous solution exhibits basicity. The alkaline compound preferably used in the step of developing the photosensitive resin composition of the present invention has a concentration of preferably 0.01 to 20% by weight, especially preferably 0.02 to 10% by weight. A temperature of the developing solution depends on a composition of the photosensitive resin composition and a composition of the alkali developing solution. Generally, the temperature of the developing solution is preferably not less than 0° C. but not more than 80° C., more preferably not less than 10° C. but not more than 60° C.

The relief pattern thus formed in the developing step is rinsed to remove unnecessary residues. Examples of a rinsing fluid used for the rinse may be water and an acidic aqueous solution.

After that, a resultant film is subjected to a heat treatment so that an imidized tetracarboxylic acid and a diamine are imidized. Thus, a cured film excellent in heat resistance can be obtained. A thickness of the cured film is determined in consideration of a thickness of wiring lines and the like, but is preferably about 2 to 50 μm. As for a final curing temperature in the heat treatment, it is desirable that the imidization be carried out by heating at a low temperature so as to prevent oxidization of the wiring lines and the like and a decrease in adhesiveness of the wiring lines to a base material.

The imidization temperature at this time is preferably not less than 100° C. but not more than 250° C., further preferably not less than 120° C. but not more than 200° C., particularly preferably not less than 130° C. but not more than 190° C. It is not preferable that a final heat temperature be high, because deterioration of the wiring lines due to oxidation is promoted.

A pattern of the cured film formed by use of the photosensitive resin composition of the present invention is excellent in heat resistance and electrical and mechanical properties, and especially in flexibility. For example, an insulating film of the present invention has a thickness of preferably about 2 to 50 µm. The insulating film upon photo-curing has a resolution power of at least up to 10 µm, and in particular, a resolution power of about 10 to 1000 µm. In view of this, the insulating film of the present invention is especially suitable as an insulating material for a high-density flexible substrate. Furthermore, the insulating film of the present invention is applicable to various types of photo-curable wiring coating protective agents, photosensitive heat-resistant adhesives, insulating coatings of an electric wire and cable, and the like.

As described above, due to excellent processability at a low temperature, the polyimide precursor composition of the present invention can be preferably used as, for example: wiring coating protective agents for protecting surfaces of printed wiring boards (including a flexible printed wiring board) made from resins such as polyimide resin, epoxy resin, and aramid resin as a base material; wiring coating protective agents for an electric wire, cable and the like; heat-resistant interlayer adhesive agents used for laminating flexible printed wiring boards; and the like. In particular, the polyimide precursor composition of the present invention is used as the wiring coating protective agents for printed wiring boards because of its excellent electrical insulating reliability.

As for a method for coating a surface of such a printed wiring board, it is possible to use the same method usable in the aforementioned production method of a coating film.

EXAMPLES

The following describes Examples of the present invention, more specifically. However, the present invention is not limited to Examples as below.

Example 1

Initially, 200 g (0.384 mol) of 2,2-bis[4-(3,4-dicarboxyphenoxy)phenyl]propane dianhydride was dispersed in 158 g of 1,2-bis(2-methoxyethoxy)ethane, and a resultant mixture was maintained at 80° C. Into the mixture, there was added 128 g (0.154 mol) of silicon diamine (siloxane diamine) (manufactured by Shin-Etsu Chemical Co., Ltd.: trade name KF8010, molecular weight 830, a silicon diamine represented by General Formula (7):

[Chem. 24]

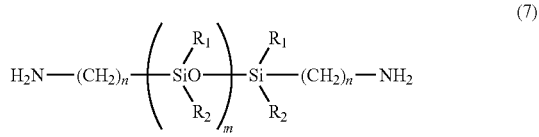

(7)

wherein each of $R_1$ and $R_2$ is a methyl group; n=3; and m=6 to 11). A resultant mixture was uniformly stirred for 30 minutes. Subsequently, the mixture was heated to 140° C. and stirred for 1 hour, and the reaction was completed. Then, the mixture was heated to 180° C. and refluxed under heating for 3 hours. After the reaction was completed, the mixture was cooled down to a room temperature, and 27.7 g (1.54 mol) of water was poured therein. A resultant solution was then uniformly stirred for 30 minutes, heated to 80° C., and refluxed under heating for 3 hours. In this way, a solution in which an imidized tetracarboxylic acid (tetracarboxylic-acid-terminated siloxane imide oligomer) was dissolved was prepared. Subsequently, the solution was cooled down to the room temperature, and 40.1 g (0.230 mol) of tolylenediisocyanate (a mixture of 80% of tolylene-2,4-diisocyanate and 20% of tolylene-2,6-diisocyanate) was added to the solution. A resultant mixing solution was then uniformly stirred for 1 hour at the room temperature, so as to prepare a polyimide precursor composition solution. The solution had a solute concentration of 70% by weight and a viscosity of 220 poise at 23° C.

In order to examine storage stability of the polyimide precursor composition solution, the solution was hermetically sealed in a 10-ml screw tube, and left to stand for 1 month in a chamber maintained at 20° C. After 1 month, the viscosity of the solution was measured. The measured viscosity at that time was 220 poise at 23° C., and thus no change in viscosity was observed. It was accordingly demonstrated that the polyimide precursor composition solution was storable for a long period of time at the room temperature.

(Preparation of Coating Film on Polyimide Film)

With the use of a Baker's applicator, the polyimide precursor composition solution was flow-cast and applied to a polyimide film (manufactured by Kaneka Corporation: trade name 75NPI) having a thickness of 75 µm so that a finally dried film had a thickness of 25 µm. A resultant coating film was dried at 120° C. for 1 hour, and heated at 160° C. for 30 minutes under a nitrogen atmosphere to carry out imidization.

(Adhesiveness of Coating Film)

Adhesive strength of the polyimide film was evaluated by a cross-cut tape method in accordance with JIS K5400 as follows:

(i) A polyimide film in which no detachment was observed in the cross-cut tape method was evaluated as "G (Good)";

(ii) A polyimide film in which half or more of grids remained was evaluated as "U (Unsatisfactory)"; and (iii) A polyimide film in which less than half of grids remained was evaluated as "P (Poor)".

(Stability of Film in Environmental Resistance Test)

In a case where a polyimide film is not sufficiently imidized, stability of the polyimide film in an environmental test apparatus is decreased. In view of this, the stability in the environmental test apparatus was measured.

With the use of a thermo-hygrostat Type: PR-1K, manufactured by ESPEC Corp., as the environmental test device, evaluation was carried out such that the coating film formed on the polyimide film had been subjected to an environment of 85° C./85% RH for 1000 hours, and then a condition of the coating film was evaluated. The evaluation was carried out as follows:

(i) A polyimide film in which a polyimide resin had no change was evaluated as "G (Good)";

(ii) A polyimide film in which a polyimide resin was partially dissolved was evaluated as "U (Unsatisfactory)"; and (iii) A polyimide film in which a polyimide resin was completely dissolved was evaluated as "P (Poor)".

(Chemical Resistance)

Evaluation of chemical resistance was carried out on a surface of the polyimide film. The evaluation was carried out based on the following evaluation items 1 to 3 in such a manner that the polyimide film was soaked and a surface of the polyimide film was observed.

Evaluation Item 1: A polyimide film was soaked in isopropanol at 25° C. for 10 minutes, and then dried by air.

Evaluation Item 2: A polyimide film was soaked in a 2N hydrochloric acid solution at 25° C. for 10 minutes. The polyimide film was then washed with purified water and dried by air.

Evaluation Item 3: A polyimide film was soaked in a 2N sodium hydroxide solution at 25° C. The polyimide film was washed with purified water and then dried by air.

The evaluation was carried out as follows:
(i) A polyimide film in which a polyimide resin had no change was evaluated as "G (Good)";
(ii) A polyimide film in which a polyimide resin was partially dissolved was evaluated as "U (Unsatisfactory)"; and
(iii) A polyimide film in which a polyimide resin was completely dissolved was evaluated as "P (Poor)".

(Flexibility Evaluation)

A polyimide resin solution was applied to a surface of a polyimide film (Apical 25NPI, manufactured by Kaneka Corporation) having a thickness of 25 μm so as to have a final film thickness of 25 μm. A resultant coating film was dried at 120° C. for 90 minutes, and then 160° C. for 30 minutes. Thus, a polyimide film laminate was prepared. The polyimide film laminate was cut out into strips of 30 mm×10 mm. Each of the strips was bent in the middle (at a point 15 mm from its edge) by 180° for 10 times. Then, a coating film (cured film) of the strip was observed with eyes to examine whether or not a crack occurred. The evaluation was carried out based on definition as follows:
(i) "G (Good)" indicates a polyimide film in which a cured film had no crack;
(ii) "U (Unsatisfactory)" indicates a polyimide film in which a cured film had a slight crack; and
(iii) "P (Poor)" indicates a polyimide film in which a cured film had a crack.

The evaluation results are shown in Table 1.

Examples 2

Initially, 200 g (0.384 mol) of 2,2-bis[4-(3,4-dicarboxyphenoxy)phenyl]propane dianhydride was dispersed in 122 g of 1,2-bis(2-methoxyethoxy)ethane, and a resultant mixture was maintained at 80° C. Into the mixture, there was added 128 g (0.154 mol) of silicon diamine (siloxane diamine) (manufactured by Shin-Etsu Chemical Co., Ltd.: trade name KF8010, molecular weight 830, a silicon diamine represented by the following General Formula (7):

[Chem. 25]

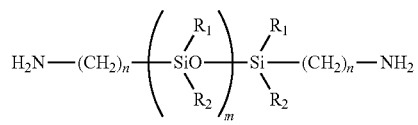

(7)

wherein each of $R_1$ and $R_2$ is a methyl group; n=3; and m=6 to 11). A resultant mixture was uniformly stirred for 30 minutes. Subsequently, the mixture was heated to 140° C. and stirred for 1 hour, and the reaction was completed. Then, the mixture was heated to 180° C. and refluxed under heating for 3 hours. After the reaction was completed, the mixture was cooled down to a room temperature, and 27.7 g (1.54 mol) of water was poured therein. A resultant solution was uniformly stirred for 30 minutes, heated to 80° C., and refluxed under heating for 3 hours. In this way, a solution in which an imidized tetracarboxylic acid (tetracarboxylic-acid-terminated siloxane imide oligomer) was dissolved was prepared. Subsequently, the solution was cooled down to the room temperature, and 132 g (0.230 mol) of a block isocyanate compound (manufactured by Mitsui Chemical Polyurethane, Inc.: trade name TAKENATE B-815N, hydrogenated diphenylmethane diisocyanate type block isocyanate, solid content is 60%, NCO content is 7.3%) was added to the solution. A resultant mixing solution was then uniformly stirred for 1 hour at the room temperature, so as to prepare a polyimide precursor composition solution. The solution had a solute concentration of 70% by weight and a viscosity of 200 poise at 23° C.

In order to examine storage stability of the polyimide precursor composition solution, the solution was hermetically sealed in a 10-ml screw tube, and left to stand for 1 month in a chamber maintained at 20° C. After 1 month, the viscosity of the solution was measured. The measured viscosity at that time was 200 poise at 23° C., and thus no change in viscosity was observed. It was accordingly demonstrated that the polyimide precursor composition solution was storable for a long period of time at the room temperature.

Further, properties of a cured coating film obtained from the polyimide precursor composition were evaluated in the same manner as Example 1. Examination results thereof are shown in Table 1.

Example 3

Initially, 200 g (0.384 mol) of 2,2-bis[4-(3,4-dicarboxyphenoxy)phenyl]propane dianhydride was dispersed in 140 g of 1,2-bis(2-methoxyethoxy)ethane, and a resultant mixture was maintained at 80° C. Into the mixture, there was added 128 g (0.154 mol) of silicon diamine (siloxane diamine) (manufactured by Shin-Etsu Chemical Co., Ltd.: trade name KF8010, molecular weight 830, a silicon diamine represented by the following General Formula (7):

[Chem. 26]

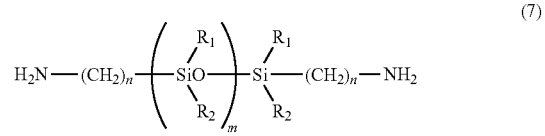

(7)

wherein each of $R_1$ and $R_2$ is a methyl group; n=3; and m=6 to 11). Then, a resultant mixture was uniformly stirred for 30 minutes. Subsequently, the mixture was heated to 140° C. and stirred for 1 hour, and the reaction was completed. Then, the mixture was heated to 180° C. and refluxed under heating for 3 hours. After the reaction was completed, the mixture was cooled down to a room temperature, and 27.7 g (1.54 mol) of water was poured therein. A resultant solution was then uniformly stirred for 30 minutes, heated to 80° C., and refluxed under heating for 3 hours. In this way, a solution in which an imidized tetracarboxylic acid (tetracarboxylic-acid-terminated siloxane imide oligomer) was dissolved was prepared. Subsequently, the solution was cooled down to the room temperature, and 66.0 g (0.115 mol) of a block isocyanate compound (manufactured by Mitsui Chemical Polyurethane, Inc.: trade name TAKENATE B-815N, hydrogenated diphenylmethane diisocyanate type block isocyanate, solid content is 60%, NCO content is 7.3%) and 20.0 g (0.115 mol) of tolylenediisocyanate (a mixture of 80% of tolylene-2,4-diisocyanate and 20% of tolylene-2,6-diisocyanate) were added to the solution. A resultant mixing solution was then uniformly stirred for 1 hour at the room temperature, so as to prepare a polyimide precursor composition solution. The solution had a solute concentration of 70% by weight and a viscosity of 210 poise at 23° C.

In order to examine storage stability of the polyimide precursor composition solution, the solution was hermetically sealed in a 10-ml screw tube, and left to stand for 1 month in a chamber maintained at 20° C. After 1 month, the viscosity of the solution was measured. The measured viscosity at that time was 210 poise at 23° C., and thus no change in viscosity was observed. It was accordingly demonstrated that the polyimide precursor composition solution was storable for a long period of time at the room temperature.

Further, properties of a cured coating film obtained from the polyimide precursor composition were evaluated in the same manner as Example 1. Examination results thereof are shown in Table 1.

Example 4

Initially, 200 g (0.384 mol) of 2,2-bis[4-(3,4-dicarboxyphenoxy)phenyl]propane dianhydride was dispersed in 179 g of 1,2-bis(2-methoxyethoxy)ethane, and a resultant mixture was maintained at 80° C. Into the mixture, there was added 172 g (0.115 mol) of silicon diamine (siloxane diamine) (manufactured by Shin-Etsu Chemical Co., Ltd.: trade name X-22-9409S, molecular weight 1492, a silicon diamine represented by the following General Formula (7):

[Chem. 27]

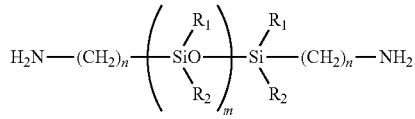

(7)

wherein each of $R_1$ and $R_2$ is a methyl group or a phenyl group; n=3; and m=9 to 12). A resultant mixture was uniformly stirred for 30 minutes. Subsequently, the mixture was heated to 140° C. and stirred for 1 hour, and the reaction was completed. Then, the mixture was heated to 180° C. and refluxed under heating for 3 hours. After the reaction was completed, the mixture was cooled down to a room temperature, and 27.7 g (1.54 mol) of water was poured therein. A resultant solution was uniformly stirred for 30 minutes, heated to 80° C., and refluxed under heating for 3 hours. In this way, a solution in which an imidized tetracarboxylic acid (tetracarboxylic-acid-terminated siloxane imide oligomer) was dissolved was prepared. Subsequently, the solution was cooled down to the room temperature, and 46.7 g (0.268 mol) of tolylenediisocyanate (a mixture of 80% of tolylene-2,4-diisocyanate and 20% of tolylene-2,6-diisocyanate) was added to the solution. A resultant mixing solution was then uniformly stirred for 1 hour at the room temperature, so as to prepare a polyimide precursor composition solution. The solution had a solute concentration of 70% by weight and a viscosity of 150 poise at 23° C.

In order to examine storage stability of the polyimide precursor composition solution, the solution was hermetically sealed in a 10-ml screw tube, and left to stand for 1 month in a chamber maintained at 20° C. After 1 month, the viscosity of the solution was measured. The measured viscosity at that time was 150 poise at 23° C., and thus no change in viscosity was observed. It was accordingly demonstrated that the polyimide precursor composition solution was storable for a long period of time at the room temperature.

Further, properties of a cured coating film obtained from the polyimide precursor composition were evaluated in the same manner as Example 1. Examination results thereof are shown in Table 1.

Example 5

Initially, 40.0 g (0.112 mol) of 4,4'-diphenyl sulfone tetracarboxylic acid dianhydride was dispersed in 64.1 g of 1,2-bis(2-methoxyethoxy)ethane, and a resultant mixture was maintained at 20° C. Into the mixture, there was added 46.3 g (0.056 mol) of silicon diamine (siloxane diamine) (manufactured by Shin-Etsu Chemical Co., Ltd.: trade name KF8010, molecular weight 830, a silicon diamine represented by the following General Formula (7):

[Chem. 28]

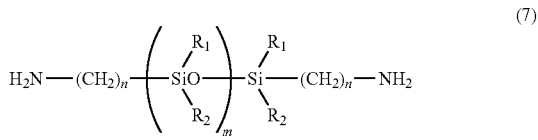

(7)

wherein each of $R_1$ and $R_2$ is a methyl group; n=3; and m=6 to 11). A resultant mixture was uniformly stirred for 90 minutes. Subsequently, the mixture was heated to 180° C. and refluxed under heating for 3 hours. After the reaction was completed, the mixture was cooled down to a room temperature, and 4.01 g (0.224 mol) of water was poured therein. The mixture was then uniformly stirred for 30 minutes, heated to 80° C., and refluxed under heating for 3 hours. In this way, a solution in which an imidized tetracarboxylic acid (tetracarboxylic-acid-terminated siloxane imide oligomer) was dissolved was prepared. Subsequently, the solution was cooled down to the room temperature, and 9.8 g (0.056 mol) of tolylenediisocyanate (a mixture of 80% of tolylene-2,4-diisocyanate and 20% of tolylene-2,6-diisocyanate) was added to the solution. A resultant mixing solution was then uniformly stirred for 1 hour at the room temperature, so as to prepare a polyimide precursor composition solution. The solution had a solute concentration of 60% by weight and a viscosity of 8 poise at 23° C.

In order to examine storage stability of the polyimide precursor composition solution, the solution was hermetically sealed in a 10-ml screw tube, and left to stand for 1 month in a chamber maintained at 20° C. After 1 month, the viscosity of the solution was measured. The measured viscosity at that time was 8 poise at 23° C., and thus no change in viscosity was observed. It was accordingly demonstrated that the polyimide precursor composition solution was storable for a long period of time at the room temperature.

Further, properties of a cured coating film obtained from the polyimide precursor composition were evaluated in the same manner as Example 1. Examination results thereof are shown in Table 1.

Example 6

Initially, 20.0 g (0.0645 mol) of 4,4'-oxydiphthalic acid dianhydride was dispersed in 32.1 g of 1,2-bis(2-methoxyethoxy)ethane, and a resultant mixture was maintained at 20°

C. Into the mixture, there was added 21.4 g (0.0258 mol) of silicon diamine (siloxane diamine) (manufactured by Shin-Etsu Chemical Co., Ltd.: trade name KF8010, molecular weight 830, a silicon diamine represented by the following General Formula (7):

[Chem. 29]

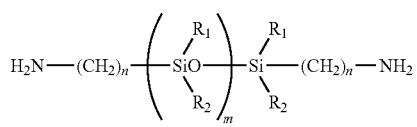

(7)

wherein each of $R_1$ and $R_2$ is a methyl group; n=3; and m=6 to 11). A resultant mixture was uniformly stirred for 90 minutes. Subsequently, the mixture was heated to 180° C. and refluxed under heating for 3 hours. After the reaction was completed, the mixture was cooled down to a room temperature, and 4.01 g (0.224 mol) of water was poured therein. A resultant solution was uniformly stirred for 30 minutes, heated to 80° C., and refluxed under heating for 3 hours. In this way, a solution in which an imidized tetracarboxylic acid (tetracarboxylic-acid-terminated siloxane imide oligomer) was dissolved was prepared. Subsequently, the solution was cooled down to the room temperature, and 6.7 g (0.0387 mol) of tolylenediisocyanate (a mixture of 80% of tolylene-2,4-diisocyanate and 20% of tolylene-2,6-diisocyanate) was added to the solution. A resultant mixing solution was then uniformly stirred for 1 hour at the room temperature, so as to prepare a polyimide precursor composition solution. The solution had a solute concentration of 60% by weight and a viscosity of 5 poise at 23° C.

In order to examine storage stability of the polyimide precursor composition solution, the solution was hermetically sealed in a 10-ml screw tube, and left to stand for 1 month in a chamber maintained at 20° C. After 1 month, the viscosity of the solution was measured. The measured viscosity at that time was 5 poise at 23° C., and thus no change in viscosity was observed. It was accordingly demonstrated that the polyimide precursor composition solution was storable for a long period of time at the room temperature.

Further, properties of a cured coating film obtained from the polyimide precursor composition were evaluated in the same manner as Example 1. Examination results thereof are shown in Table 1.

Example 7

Initially, 300 g (0.576 mol) of 2,2-bis[4-(3,4-dicarboxyphenoxy)phenyl]propane dianhydride was dispersed in 421 g of 1,2-bis(2-methoxyethoxy)ethane, and a resultant mixture was maintained at 80° C. Into the mixture, there was added 272 g (0.231 mol) of polycarbonatediol bis(4-aminobenzoate) (a diamine represented by the following General Formula (8):

[Chem. 30]

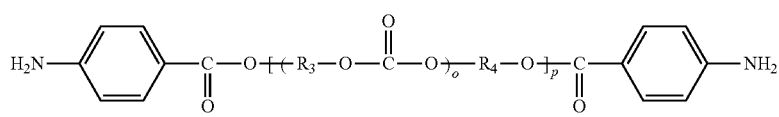

(8)

wherein $R_3$ is a hexamethylene group; $R_4$ is a pentamethylene group; o and p is 1 to 20; and a molecular weight is 1180). A resultant mixture was uniformly stirred for 30 minutes. Subsequently, the mixture was heated to 140° C. and stirred for 1 hour. After the reaction was completed, the mixture was heated to 180° C. and refluxed under heating for 3 hours. After the reaction was completed, the mixture was cooled down to a room temperature, and 27.7 g (1.54 mol) of water was poured therein. A resultant solution was uniformly stirred for 30 minutes, heated to 80° C., and refluxed under heating for 3 hours. In this way, a solution in which an imidized tetracarboxylic acid was dissolved was prepared. Subsequently, the solution was cooled down to the room temperature, and 60.1 g (0.345 mol) of tolylenediisocyanate (a mixture of 80% of tolylene-2,4-diisocyanate and 20% of tolylene-2,6-diisocyanate) was added to the solution. A resultant mixing solution was then uniformly stirred for 1 hour at the room temperature, so as to prepare a polyimide precursor composition solution. The solution had a solute concentration of 60% by weight and a viscosity of 180 poise at 23° C.

In order to examine storage stability of the polyimide precursor composition solution, the solution was hermetically sealed in a 10-ml screw tube, and left to stand for 1 month in a chamber maintained at 20° C. After 1 month, the viscosity of the solution was measured. The measured viscosity at that time was 180 poise at 23° C., and thus no change in viscosity was observed. It was accordingly demonstrated that the polyimide precursor composition solution was storable for a long period of time at the room temperature.

Further, properties of a cured coating film obtained from the polyimide precursor composition were evaluated in the same manner as Example 1. Examination results thereof are shown in Table 1.

Example 8

Initially, 300 g (0.576 mol) of 2,2-bis[4-(3,4-dicarboxyphenoxy)phenyl]propane dianhydride was dispersed in 396 g of 1,2-bis(2-methoxyethoxy)ethane, and a resultant mixture was maintained at 80° C. Into the mixture, there were added 239 g (0.288 mol) of silicon diamine (siloxane diamine) (manufactured by Shin-Etsu Chemical Co., Ltd.: trade name KF8010, molecular weight 830, a silicon diamine represented by the following General Formula (7):

[Chem. 31]

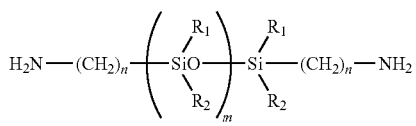

(7)

wherein each of $R_1$ and $R_2$ is a methyl group; n=3; and m=6 to 11) and further 14.3 g (0.058 mol) of 3,3'-diamino diphenyl sulfone. A resultant mixture was then uniformly stirred for 30 minutes. Subsequently, the mixture was heated to 140° C. and stirred for 1 hour, and the reaction was completed. Then, the mixture was heated to 180° C. and refluxed under heating for 3 hours. After the reaction was completed, the mixture was cooled down to a room temperature, and 41.5 g (2.30 mol) of water was poured therein. A resultant solution was uniformly stirred for 30 minutes, heated to 80° C., and refluxed under heating for 3 hours. In this way, a solution in which an imidized tetracarboxylic acid (tetracarboxylic-acid-terminated siloxane imide oligomer) was dissolved was prepared. Subsequently, the solution was cooled down to the room temperature, and 40.1 g (0.230 mol) of tolylenediisocyanate (a mixture of 80% of tolylene-2,4-diisocyanate and 20% of tolylene-2,6-diisocyanate) was added to the solution. A resultant mixing solution was then uniformly stirred for 1 hour at the room temperature, so as to prepare a polyimide precursor composition solution. The solution had a solute concentration of 60% by weight and a viscosity of 120 poise at 23° C.

In order to examine storage stability of the polyimide precursor composition solution, the solution was hermetically sealed in a 10-ml screw tube, and left to stand for 1 month in a chamber maintained at 20° C. After 1 month, the viscosity of the solution was measured. The measured viscosity at that time was 120 poise at 23° C., and thus no change in viscosity was observed. It was accordingly demonstrated that the polyimide precursor composition solution was storable for a long period of time at the room temperature.

In formation of a coating film, on a surface of a polyimide film, from the polyimide precursor composition solution, the coating film was dried at 120° C. for 90 minutes and then dried under a nitrogen atmosphere at 190° C. for 30 minutes. Except for this, examination was carried out in the same manner as Example 1 to evaluate the coating film. Evaluation results thereof are shown in Table 1.

Comparative Example 1

Initially, 2.73 g (23.5 mmol) of hexamethylenediamine was dissolved in 24.0 g of dimethylacetamide, and then 3.78 g (11.75 mmol) of 3,3',4,4'-benzophenone tetracarboxylic acid dianhydride was gradually added thereto over 30 minutes, so as to prepare an oligomer having a polyamide bond. A resultant mixture was uniformly stirred for 1 hour, 3.02 g (9.40 mmol) of 3,3',4,4'-benzophenone tetracarboxylic acid was added thereto, and then kept stirred for another 1 hour. Thus, a viscous solution (solute concentration: 28% by weight) was prepared. As a result of measurement, it was found that the solution had a viscosity of 3100 poise.

In order to examine storage stability of the solution thus prepared, the solution was hermetically sealed in a 10-ml screw tube, and left to stand for 1 month in a chamber maintained at 20° C. After 1 month, the viscosity of the solution was measured. The measured viscosity at that time was 300 poise at 23° C., and thus a large change in viscosity was observed. It was accordingly found that the solution had a problem in storage stability.

Further, evaluation was carried out on the solution in the same manner as Example 1. Evaluation results thereof are shown in Table 2.

Comparative Example 2

Initially, 200 g (0.384 mol) of 2,2-bis[4-(3,4-dicarboxyphenoxy)phenyl]propane dianhydride was dispersed in 183 g of 1,2-bis(2-methoxyethoxy)ethane, and a resultant mixture was maintained at 80° C. Into the mixture, there was added 128 g (0.154 mol) of silicon diamine (siloxane diamine) (manufactured by Shin-Etsu Chemical Co., Ltd.: trade name KF8010, molecular weight 830, a silicon diamine represented by the following General Formula (7):

[Chem. 32]

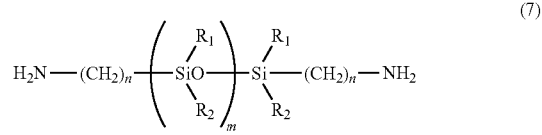

(7)

wherein each of $R_1$ and $R_2$ is a methyl group; n=3; and m=6 to 11). A resultant mixture was uniformly stirred for 30 minutes. Subsequently, the mixture was heated to 140° C. and stirred for 1 hour, and the reaction was completed. Then, the mixture was heated to 180° C. and refluxed under heating for 3 hours. After the reaction was completed, the mixture was cooled down to a room temperature, and 49.3 g (1.54 mol) of methanol was poured therein. A resultant solution was uniformly stirred for 30 minutes, heated to 80° C., and refluxed under heating for 3 hours. In this way, an imide solution in which a terminal carboxylic acid was half-esterified was prepared. Subsequently, the imide solution was cooled down to the room temperature, and 99.7 g (0.230 mol) of bis[4-(3-aminophenoxy)phenyl]sulfone was added thereto. A resultant mixing solution was then uniformly stirred for 1 hour at the room temperature, so as to prepare a polyimide precursor composition solution. The solution thus prepared had a solute concentration of 70% by weight and a viscosity of 120 poise at 23° C.

In order to examine storage stability of the solution thus obtained, the solution was hermetically sealed in a 10-ml screw tube, and left to stand for 1 month in a chamber maintained at 20° C. After 1 month, the viscosity of the solution was measured. The measured viscosity at that time was 120 poise at 23° C., and thus no change in viscosity was observed. It was accordingly demonstrated that the solution thus prepared was storable for a long period of time at the room temperature.

Further, evaluation was carried out on the solution in the same manner as Example 1. Evaluation results thereof are shown in Table 2.

According to the evaluation results, it was found that the solution had poor stability in the environmental resistance test, poor solvent resistance, and poor alkali resistance.

Comparative Example 3

Initially, 8.22 g (41.1 mmol) of 4,4'-diaminodiphenylether was dispersed in 55.0 g of N,N-dimethylacetamide, and stirred at a room temperature. Into a resultant mixture added was 11.9 g (54.8 mmol) of pyromellitic acid dianhydride. An obtained mixture was stirred for 2 hours at the room temperature. Then, 1.32 g (41.1 mmol) of methanol and 0.066 g of dimethylaminoethanol were added thereto, and stirred under heating for 2 hours in a hot water bath at 70° C. After a resultant mixture was cooled down to the room temperature, 2.74 g (13.7 mmol) of 4,4'-diaminodiphenylether was added thereto, and the resultant mixture was kept stirred for another 1 hour, so as to prepare a uniform solution. The solution thus prepared had a viscosity of 18 poise at 23° C.

In order to examine storage stability of the solution thus prepared, the solution was hermetically sealed in a 10-ml screw tube, and left to stand for 1 month in a chamber maintained at 20° C. After 1 month, the viscosity of the solution was measured. The measured viscosity at that time was 50 poise at 23° C., and thus it was found that the solution had a problem in storage stability at the room temperature.

Evaluation was carried out on the solution in the same manner as Example 1. Evaluation results thereof are shown in Table 2.

Comparative Example 4

Initially, 200 g (0.384 mol) of 2,2-bis[4-(3,4-dicarboxyphenoxy)phenyl]propane dianhydride was dispersed in 183 g of 1,2-bis(2-methoxyethoxy)ethane, and a resultant mixture was maintained at 80° C. Into the mixture, there was added 128 g (0.154 mol) of silicon diamine (siloxane diamine) (manufactured by Shin-Etsu Chemical Co., Ltd.: trade name KF8010, molecular weight 830, a silicon diamine represented by the following General Formula (7):

[Chem. 33]

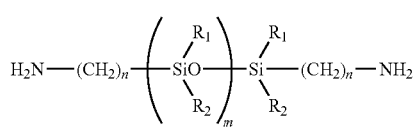

(7)

wherein each of $R_1$ and $R_2$ is a methyl group; n=3; and m=6 to 11). A resultant mixture was uniformly stirred for 30 minutes. Subsequently, the mixture was heated to 140° C. and stirred for 1 hour. After the reaction was completed, the mixture was heated to 180° C. and refluxed under heating for 3 hours. Then, the mixture was cooled down to the room temperature, and 27.7 g (1.54 mol) of water was added thereto. A resultant solution was uniformly stirred for 30 minutes, heated to 80° C., and refluxed under heating for 3 hours. In this way, a solution in which an imidized tetracarboxylic acid was dissolved was prepared.

Evaluation was carried out, in the same manner as Example 1, on the solution in which the imidized tetracarboxylic acid was dissolved but no isocyanate compound was contained. Examination results thereof are shown in Table 2.

Comparative Example 5

Initially, 7.00 g (32.1 mmol) of pyromellitic acid dianhydride was dispersed in 31.3 g of 1,2-bis(2-methoxyethoxy) ethane, and then 2.31 g of water was added thereto. A resultant solution was stirred at 80° C. for 10 hours, so as to prepare a pyromellitic acid solution. Into the solution, 6.43 g (32.1 mmol) of 4,4-diaminodiphenylether was added, so as to prepare a solution.

Formation of a film was attempted with the use of the solution in the same manner as the evaluation method of Example 1. However, the solution was solidified on a surface of a polyimide film and was not formed into a film.

Comparative Example 6

Initially, 200 g (0.384 mol) of 2,2-bis[4-(3,4-dicarboxyphenoxy)phenyl]propane dianhydride was dispersed in 183 g of 1,2-bis(2-methoxyethoxy)ethane, and a resultant mixture was maintained at 80° C. Into the mixture, there was added 128 g (0.154 mol) of silicon diamine (siloxane diamine) (manufactured by Shin-Etsu Chemical Co., Ltd.: trade name KF8010, molecular weight 830, a silicon diamine represented by the following General Formula (7):

[Chem. 34]

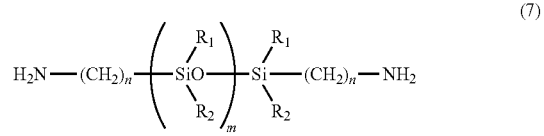

(7)

wherein each of $R_1$ and $R_2$ is a methyl group; n=3; and m=6 to 11). A resultant mixture was uniformly stirred for 30 minutes. Subsequently, the mixture was heated to 140° C. and stirred for 1 hour. After the reaction was completed, the mixture was heated to 180° C. and refluxed under heating for 3 hours. The mixture was then cooled down to a room temperature. Instead of adding water thereto, 99.7 g (0.230 mol) of bis[4-(3-aminophenoxy)phenyl]sulfone was added, and a resultant solution was uniformly stirred for 1 hour at the room temperature, so as to prepare a polyimide precursor composition solution. The solution was a highly viscous elastic material having a solute concentration of 70% by weight and a viscosity of not less than 10000 poise at 23° C. Even though the solution was diluted so as to have a solute concentration of 20% by weight, the solution still had a very high viscosity of 6000 poise at 23° C. Therefore, property values of the solution could not be evaluated.

Synthesis Example 1

Initially, 200 g (0.384 mol) of 2,2-bis[4-(3,4-dicarboxyphenoxy)phenyl]propane dianhydride (hereinafter, referred to as BPADA) was dispersed in 140 g of 1,2-bis(2-methoxyethoxy)ethane, and a resultant mixture was maintained at 80° C. Into the mixture, there was added 128 g (0.154 mol) of silicon diamine (siloxane diamine) (manufactured by Shin-Etsu Chemical Co., Ltd.: trade name KF8010, molecular weight 830; in the silicon diamine, each of $R_1$ and $R_2$ in General Formula (7) is a methyl group, n=3, and m=6 to 11). A resultant mixture was uniformly stirred fir 30 minutes. Subsequently, the mixture was heated to 140° C. and uniformly stirred for 1 hour. Then, the mixture was heated to 180° C. and refluxed under heating for 3 hours, so as to carry out imidization reaction. After the mixture was cooled down to 80° C., 27.7 g (1.54 mol) of water was added thereto, and a resultant solution was refluxed under heating for 5 hours. In this way, a solution in which an imidized tetracarboxylic acid (tetracarboxylic-acid-terminated siloxane imide oligomer) was dissolved was prepared. The solution thus prepared had a solid concentration of 66% by weight and a viscosity of 140 poise at 23° C. Even after the solution containing the terminal tetracarboxylic acid was left for stand for 1 month at a room temperature, a change in viscosity was hardly observed. Thus, the solution was stable. A compound synthesized in this manner is referred to as a compound A.

Synthesis Example 2

Initially, 200 g (0.384 mol) of BPADA was dispersed in 159 g of 1,2-bis(2-methoxyethoxy)ethane, and a resultant mixture was maintained at 80° C. Into the mixture added was 172 g (0.115 mol) of silicon diamine (siloxane diamine) (manufactured by Shin-Etsu Chemical Co., Ltd.: trade name X-22-94095, molecular weight 1492; in the silicon diamine, each of $R_1$ and $R_2$ in the formula is a methyl group or a phenyl group, n=3, and m=9 to 12). A resultant mixture was uniformly stirred for 30 minutes. Subsequently, the mixture was heated to 140° C. and uniformly stirred for 1 hour. After that, the mixture was heated to 180° C. and refluxed under heating for 3 hours, so as to carry out imidization reaction. After the mixture was cooled down to 80° C., 27.7 g (1.54 mol) of water was added thereto, and a resultant solution was refluxed under heating for 5 hours. In this way, a solution in which an imidized tetracarboxylic acid (tetracarboxylic-acid-terminated siloxane imide oligomer) was dissolved was prepared. The solution thus prepared had a solid concentration of 67% by weight and a viscosity of 120 poise at 23° C. Even after the solution containing the terminal tetracarboxylic acid was left for stand for 1 month at a room temperature, a change in viscosity was hardly observed. Thus, the solution was stable. A compound synthesized in this manner is referred to as a compound B.

Synthesis Example 3

Initially, 200 g (0.384 mol) of BPADA was dispersed in 154 g of 1,2-bis(2-methoxyethoxy)ethane, and a resultant mixture was maintained at 80° C. Into the mixture, there was added 159 g (0.192 mol) of silicon diamine (siloxane diamine) (manufactured by Shin-Etsu Chemical Co., Ltd.: trade name KF8010, molecular weight 830; in the silicon diamine, each of $R_1$ and $R_2$ in General Formula (7) is a methyl group, n=3, and m=6 to 11). A resultant mixture was uniformly stirred for 30 minutes. Subsequently, the mixture was heated to 140° C. and uniformly stirred for 1 hour. After that, the mixture was heated to 180° C. and refluxed under heating for 3 hours, so as to carry out imidization reaction. After the mixture was cooled down to 80° C., 27.7 g (1.54 mol) of water was added thereto, and a resultant solution was refluxed under heating for 5 hours. In this way, a solution in which an imidized tetracarboxylic acid (tetracarboxylic-acid-terminated siloxane imide oligomer) was dissolved was prepared. The solution thus prepared had a solid concentration of 66% by weight and a viscosity of 100 poise at 23° C. Even after the solution containing the terminal tetracarboxylic acid was left for stand for 1 month at a room temperature, a change in viscosity was hardly observed. Thus, the solution was stable. A compound synthesized in this manner is referred to as a compound C.

Synthesis Example 4

Initially, 200 g (0.384 mol) of BPADA was dispersed in 184 g of 1,2-bis(2-methoxyethoxy)ethane, and a resultant mixture was maintained at 80° C. Into the mixture added was 229 g (0.154 mol) of silicon diamine (siloxane diamine) (manufactured by Shin-Etsu Chemical Co., Ltd.: trade name X-22-9409S, molecular weight 1492; in the silicon diamine, each of $R_1$ and $R_2$ in the formula is a methyl group or a phenyl group, n=3, and m=9 to 12). A resultant mixture was uniformly stirred for 30 minutes. Subsequently, the mixture was heated to 140° C. and uniformly stirred for 1 hour. After that, the mixture was heated to 180° C. and refluxed under heating for 3 hours, so as to carry out imidization reaction. After the mixture was cooled down to 80° C., 27.7 g (1.54 mol) of water was added thereto. A resultant solution was uniformly stirred for 30 minutes, heated to 80° C., and refluxed under heating for 5 hours. In this way, a solution in which an imidized tetracarboxylic acid (tetracarboxylic-acid-terminated siloxane imide oligomer) was dissolved was prepared. The solution thus prepared had a solid concentration of 67% by weight and a viscosity of 90 poise at 23° C. Even after the solution containing the terminal tetracarboxylic acid was left for stand for 1 month at a room temperature, a change in viscosity was hardly observed. Thus, the solution was stable. A compound synthesized in this manner is referred to as a compound D.

Synthesis Example 5

A compound was prepared in the same manner as Synthesis Example 1 except that, instead of water, ethanol was added to a mixture obtained after the reaction was completed, so that the mixture was half-esterified. The compound synthesized in this manner is referred to as a compound E.

Synthesis Example 6

A compound was prepared in the same manner as Synthesis Example 1 except that no water was added to a mixture obtained after the reaction was completed. Thus, an imidized acid anhydride having an anhydride group at its terminal. The compound thus prepared is referred to as a compound F.

Examples 9 to 12

Into a terminal tetracarboxylic acid (referred to as a component (A) in Table 3) prepared in each of Synthesis Examples 1 to 4, there were added an isocyanate compound (referred to as a component (B) in Table 3), a photosensitive resin (referred to as a component (C) in Table 3), a photopolymerization initiator (referred to as a component (D) in Table 3), and an organic solvent, so as to prepare a photosensitive resin composition solution. Respective amounts of constituent raw materials in terms of resin solid content and the types of raw materials are shown in Table 3. In Table 3, the amount of 1,2-bis(2-methoxyethoxy)ethane as a solvent indicates a total amount of solvent including a solvent contained in the photosensitive resin composition solution and the like.

The photosensitive resin composition thus prepared was initially mixed by a stirring device equipped with a general stirring blade, and a resultant solution was then passed through a triple-roll mill two times to prepare a uniform mixture solution. The mixture solution was then completely deaerated with a deaerator, and the following evaluation was carried out on a resultant.

Evaluation results are shown in Table 4.

(Preparation of Coating Film on Polyimide Film)

With the use of a Baker's applicator, the photosensitive resin composition solution was flow-cast and applied to a polyimide film (manufactured by Kaneka Corporation: trade name 75NPI) having a thickness of 75 µm in an area of 100 mm×100 mm so as to have a final film thickness of 25 µm, and dried 80° C. for 20 minutes. Ten dried films were prepared in this manner. For nine of the films, a negative photomask in which an area of 50 mm×50 mm was completely transparent was placed thereon. For one of the films, a negative photomask of line width/space width=100 µm/100 µm (a photomask on which 10 lines of 30 mm in length×100 µm in width remain) was placed thereon. These films were exposed to 300 mJ/cm$^2$ of ultraviolet rays under a nitrogen atmosphere. Thus sensitized films were developed by spraying a 1.0 weight % sodium carbonate aqueous solution heated at 30° C., at a spraying pressure of 1.0 kgf/mm$^2$ for 30 seconds. After the development, the films were washed with purified water sufficiently, and then dried by heating in an oven at 170° C. for 60 minutes. Thus, cured films of each of the photosensitive resin compositions were prepared.

(Photosensitivity Evaluation)

The photosensitivity of each of the photosensitive resin compositions was evaluated by observing a surface of the cured film prepared in the aforementioned item (Preparation of Coating Film on Polyimide Film). The evaluation was based on definition as follows:

(i) "G (Good)" indicates a polyimide film in which a sensitive pattern of line width/space width=100/100 µm was clearly formed on a surface thereof, no deformation of lines caused by detachment of line portions occurred, and dissolution residues were not observed on space portions;

(ii) "U (Unsatisfactory)" indicates a polyimide film in which a sensitive pattern of line width/space width=100/100 µm was clearly formed on a surface thereof, deformation of lines caused by detachment of line portions occurred, but dissolution residues were not observed on space portions; and (iii) "P (Poor)" indicates a polyimide film in which a sensitive pattern of line width/space width=100/100 µm was not clearly formed on a surface thereof, line portions were detached, and dissolution residues were observed on space portions.

(Adhesiveness of Coating Film)

The adhesive strength of each of the cured films of the photosensitive resin compositions, prepared in the aforementioned item (Preparation of Coating Film on Polyimide Film), was evaluated by a cross-cut tape method in accordance with JIS K5400 as follows:

(i) A cured film in which no detachment was observed in the cross-cut tape method was evaluated as "G (Good)";

(ii) A cured film in which 95% or more of grids remained was evaluated as "U (Unsatisfactory)"; and (iii) A cured film in which the amount of remaining grids was less than 80% was evaluated as "P (Poor)".

(Solvent Resistance)

The solvent resistance of each of the cured films of the photosensitive resin compositions, prepared in the aforementioned item (Preparation of Coating Film on Polyimide Film), was evaluated. The evaluation was carried out in such a manner that after a cured film was immersed in isopropanol at 25° C. for 15 minutes, the cured film was dried by air, and a surface of the cured film thus dried was observed. The evaluation was based on definition as follows:

(i) "G (Good)" indicates a coating film (cured film) having no problem; and (ii) "P (Poor)" indicates a coating film (cured film) having a problem.

(Acid Resistance)

The acid resistance of each of the cured films of the photosensitive resin compositions, prepared in the aforementioned item (Preparation of Coating Film on Polyimide Film), was evaluated. The evaluation was carried out in such a manner that after a cured film was immersed in a 2N hydrochloric acid solution at 25° C. for 15 minutes, the cured film was dried by air, and a surface of the cured film was observed. The evaluation was based on definition as follows:

(i) "G (Good)" indicates a coating film (cured film) having no problem (whitening or detachment); and (ii) "P (Poor)" indicates a coating film (cured film) having a problem (whitening or detachment).

(Alkali Resistance)

The alkali resistance of each of the cured films of the photosensitive resin compositions, prepared in the aforementioned item (Preparation of Coating Film on Polyimide Film), was evaluated. The evaluation was carried out in such a manner that after a cured film was immersed in a 2N sodium hydroxide solution at 25° C. for 15 minutes, the cured film was dried by air, and a surface of the cured film was observed. The evaluation was based on definition as follows:

(i) "G (Good)" indicates a coating film (cured film) having no problem (whitening or detachment); and (ii) "P (Poor)" indicates a coating film (cured film) having a problem (whitening or detachment).

(Flexibility)

In the same manner as in the item (Preparation of Coating Film on Polyimide Film), each of the photosensitive resin composition was applied on a surface of a polyimide film (Apical 25 NPI manufactured by Kaneka Corporation) having a thickness of 25 µm, so as to prepare a cured-film-laminated film. The cured-film-laminated film was then cut out into strips of 30 mm×10 mm. Each of the strips was bent in the middle (at a point 15 mm from its edge) by 180° for 10 times. Then, a coating film (cured film) of the strip was observed with eyes to examine whether or not a crack occurred. The evaluation was carried out based on definition as follows:

(i) "G (Good)" indicates a polyimide film in which a cured film had no crack;

(ii) "U (Unsatisfactory)" indicates a polyimide film in which a cured film had a slight crack; and (iii) "P (Poor)" indicates a polyimide film in which a cured film had a crack.

(Moisture-Resistance Insulating Property)

On a flexible copper-clad laminate (the thickness of a copper foil is 12 µm, a polyimide film is Apical 25 NPI manufactured by Kaneka Corporation, and the copper foil is bonded by a polyimide adhesive agent), a comb-shaped pattern (line width/space width=100 µm/100 µm) was formed. The flexible copper-clad laminate was then immersed in a 10 volume % sulfuric acid aqueous solution for 1 minute, washed with purified water, and subjected to a surface treatment of the copper foil. After that, in the same manner as the preparation of a cured film on the polyimide film, a cured film of the photosensitive resin composition was formed on the comb-shaped pattern, so as to prepare a test piece. The test piece was set in an environmental test apparatus at 85° C. and 85% RH, and a direct current at 100 V was applied to both ends of the test piece, so as to observe a change in insulation resistance values, an occurrence of migration, and the like. The evaluation was carried out based on definition as follows:

(i) "G (Good)" indicates one in which 500 hours after the start of the test, a resistance value was not less than $10^6$ and no occurrence of migration, formation of dendrites, or the like was observed;

(ii) "P (Poor)" indicates one in which 500 hours after the start of the test, an occurrence of migration, formation of dendrites, or the like was observed.

Example 13

Evaluation was carried out in the same manner as in Example 9 except that 5 parts by weight of an epoxy resin (cresol novolac-type polyfunctional epoxy resin EPICLON N-665) was added relative to 100 parts by weight of the solid content of the photosensitive resin composition of Example 9. Further, a solder heat resistance test was carried out by the following manner to evaluation solder heat resistance. Evaluation results thereof are shown in Table 4.

(Solder Heat Resistance)

With the use of a Baker's applicator, the photosensitive resin composition solution was flow-cast and applied to a polyimide film (manufactured by Kaneka Corporation: trade name 75NPI) having a thickness of 75 µm in an area of 100 mm×100 mm so as to have a final dried thickness of 25 µm. After a resultant coating film was, dried at 80° C. for 20 minutes, a negative photomask in which an area of 50 mm×50 mm was completely transparent was placed on the coating film. The coating film was then exposed to 300 mJ/cm² of ultraviolet rays under a nitrogen atmosphere. Thus sensitized film was developed by spraying a 1.0 weight % sodium carbonate aqueous solution heated to 30° C., at a spraying pressure of 1.0 kgf/mm² for 30 seconds. After the development, the film was washed with purified water sufficiently, and then dried by heating in an oven at 170° C. for 60 minutes. Thus, a cured film of the photosensitive resin composition was prepared. A resultant coated film was floated on a solder bath that was completely melted at 260° C. so that a surface of the coated film on which surface the cured film of the photosensitive resin composition was formed made contact with the solder bath. Ten seconds later, the coated film was pulled up. This operation was repeated 3 times, and the adhesive strength of the cured film was evaluated by a cross-cut tape method in accordance with JIS K5400 as follows:

(i) A cured film in which no detachment was observed in the cross-cut tape method was evaluated as "G (Good)";
(ii) A cured film in which 95% or more of grids remained was evaluated as "U (Unsatisfactory)"; and
(iii) A cured film in which the amount of remaining grids was less than 80% was evaluated as "P (Poor)".

Example 14

Evaluation was carried out in the same manner as in Example 9 except that 5 parts by weight of an epoxy resin (cresol novolac-type polyfunctional epoxy resin EPICLON N-665) was added relative to 100 parts by weight of the solid content of the photosensitive resin composition of Example 10. Further, a solder heat resistance test was carried out by the same method as in Example 13 to evaluation solder heat resistance. Evaluation results thereof are shown in Table 4.

Comparative Example 7

A photosensitive resin composition solution was prepared by the same method as in Example 9 except that the half-esterified compound obtained in Synthesis Example 5 was used, and the photosensitive resin composition solution thus prepared was evaluated by the same method as in Example 9. Evaluation results thereof are shown in Table 5. The solution was not sufficiently imidized and had a very poor moisture-resistance insulating property.

Comparative Example 8

As for the compound synthesized in Comparative Example 6, an anhydride-group-terminated imide siloxane oligomer was reacted with a diamino compound, thereby preparing a highly viscous solution. In order to evaluate the solution, 1,2-bis(2-methoxyethoxy)ethane was added to the solution so as to decrease the viscosity of the solution to a range in which the solution could be used. Evaluation results are shown in Table 5. It is found that the solution had poor photosensitivity.

TABLE 1

|  |  | Ex. 1 | Ex. 2 | Ex. 3 | Ex. 4 | Ex. 5 | Ex. 6 | Ex. 7 | Ex. 8 |
|---|---|---|---|---|---|---|---|---|---|
| Adhesiveness Of Coating Film |  | G | G | G | G | G | G | G | G |
| Stability of Film in Environmental Resistance Test |  | G | G | G | G | G | G | G | G |
| Chemical Resistance | Evaluation Item 1 | G | G | G | G | G | G | G | G |
|  | Evaluation Item 2 | G | G | G | G | G | G | G | G |
|  | Evaluation Item 3 | G | G | G | G | G | G | G | G |
| Flexibility Evaluation |  | G | G | G | G | G | G | G | G |

Abbreviation:
Ex. stands for Example.
G stands for Good.

TABLE 2

|  |  | Com. Ex. 1 | Com. Ex. 2 | Com. Ex. 3 | Com. Ex. 4 |
|---|---|---|---|---|---|
| Adhesiveness Of Coating Film |  | P | G | P | P |
| Stability of Film in Environmental Resistance Test |  | P | P | P | P |
| Chemical Resistance | Evaluation Item 1 | P | U | P | P |
|  | Evaluation Item 2 | P | P | P | P |
|  | Evaluation Item 3 | P | U | P | P |
| Flexibility Evaluation |  | P | G | P | P |

Abbreviation:
Com. Ex. stands for Comparative Example;
G stands for Good;
U stands for Unsatisfactory; and
P stands for Poor.

TABLE 3

Unit: Part by Weight

| Component |  | Ex. 9 | Ex. 10 | Ex. 11 | Ex. 12 | Com. Ex. 7 | Com. Ex. 8 |
|---|---|---|---|---|---|---|---|
| (A) | Compound A | 51.6 |  |  |  |  |  |
|  | Compound B |  | 55.6 |  |  |  |  |
|  | Compound C |  |  | 54.6 |  |  |  |
|  | Compound D |  |  |  | 58.2 |  |  |
|  | Compound E |  |  |  |  | 51.6 |  |
|  | Compound F |  |  |  |  |  | 51.6 |

TABLE 3-continued

| Component | | Ex. 9 | Ex. 10 | Ex. 11 | Ex. 12 | Com. Ex. 7 | Com. Ex. 8 |
|---|---|---|---|---|---|---|---|
| (B) | Trilene diisocyanate *1 | 6.3 | | 5.1 | | 6.3 | 6.3 |
| | B-815N *2 | | 27.7 | | 21.5 | | |
| (C) | M-5710 *3 | 11.6 | 11.6 | 11.6 | 11.6 | 11.6 | 11.6 |
| | BPE-1300N *4 | 5.8 | 5.8 | 5.8 | 5.8 | 5.8 | 5.8 |
| (D) | IRGACURE 819 *5 | 1.8 | 1.8 | 1.8 | 1.8 | 1.8 | 1.8 |
| Others | Talc | 13.5 | 13.5 | 13.5 | 13.5 | 13.5 | 13.5 |
| | 1,2-bis(2-methoxyethoxy)ethane | 62 | 62 | 62 | 62 | 62 | 300 |
| | Solid Content Concentration of Photosensitive Resin Composition | 59 | 65 | 59 | 63 | 59 | 25 |

Abbreviation:
Ex. stands for Example; and
Com. Ex. stands for Comparative Example.
*1: A mixture of 80% of tolylene-2,4-diisocyanate and 20% of tolylene-2,6-diisocyanate
*2: Manufactured by Mitsui Chemical Polyurethane, Inc.: trade name TAKENATE B-815N; hydrogenated diphenylmethane diisocyanate block isocyanate; Solid Content of 60%; NCO content of 7.3%
*3: Manufactured by Toagosei Co., Ltd.: trade name M-5710 (2-hydroxy-3-phenoxypropyl acrylate)
*4: Manufactured by Shin-Nakamura Chemical Co., Ltd.: bisphenol A EO-denatured diacrylate, molecular weight of 1684
*5: Manufactured by CIBA Specialty Chemicals Inc.,: Photopolymerization Initiator

TABLE 4

| Evaluation Item | Ex. 9 | Ex. 10 | Ex. 11 | Ex. 12 | Ex. 13 | Ex. 14 |
|---|---|---|---|---|---|---|
| Photosensitivity | G | G | G | G | G | G |
| Adhesiveness | G | G | G | G | G | G |
| Solvent Resistance | G | G | G | G | G | G |
| Acid Resistance | G | G | G | G | G | G |
| Alkali Resistance | G | G | G | G | G | G |
| Flexibility | G | G | G | G | G | G |
| Moisture-resistance Insulating Property | G | G | G | G | G | G |
| Solder Heat Resistance | — | — | — | — | G | G |

Abbreviation:
Ex. stands for Example.

TABLE 5

| Evaluation Item | Com. Ex. 7 | Com. Ex. 8 |
|---|---|---|
| Photosensitivity | U | P |
| Adhesiveness | G | G |
| Solvent Resistance | G | G |
| Acid Resistance | G | G |
| Alkali Resistance | G | G |
| Flexibility | G | G |
| Moisture-resistance Insulating Property | P | G |

Abbreviation:
Com. Ex. stands for Comparative Example.

The invention claimed is:

1. A polyimide precursor composition containing at least an isocyanate compound and an imidized tetracarboxylic acid represented by General Formula (1):

[Chem. 1]

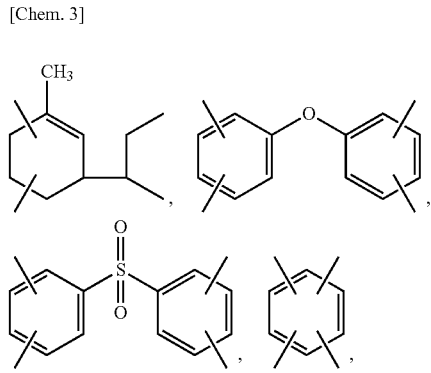

(1)

wherein each R independently represents a tetravalent organic group; each R' independently represents a divalent organic group; l represents an integer of 0 to 20 and wherein the isocyanate compound and the imidized tetracarboxylic acid represented by General Formula (1) have no covalent bond.

2. The polyimide precursor composition as set forth in claim 1, further containing a diamine represented by General Formula (2):

[Chem. 2]

$$H_2N-R''-NH_2 \qquad (2)$$

wherein R" represents a divalent organic group.

3. The polyimide precursor composition as set forth in claim 1, wherein R in General Formula (1) is a tetravalent organic group selected from General Formula Group (1):

[Chem. 3]

Group (1)

-continued

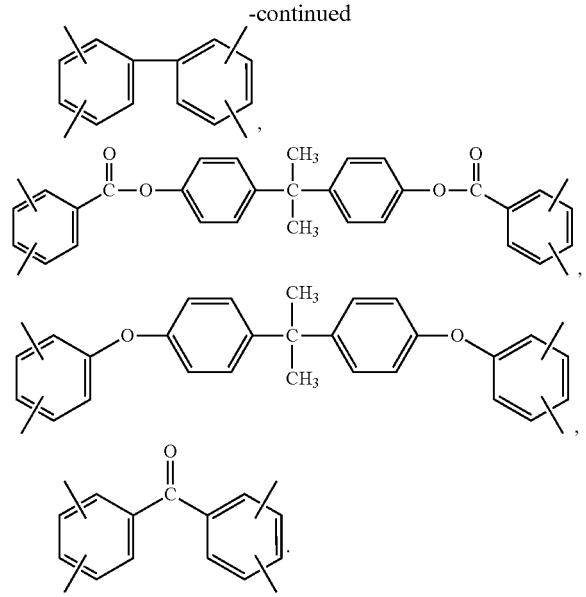

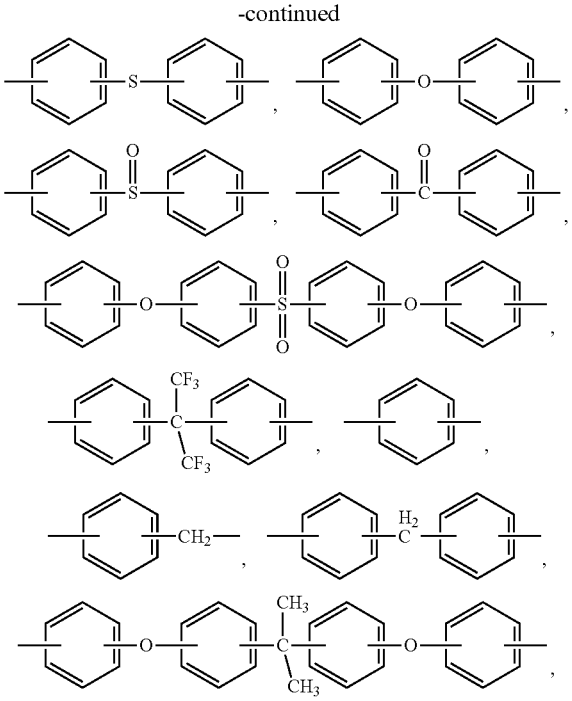

4. The polyimide precursor composition as set forth in claim 1, wherein R' in General Formula (1) has at least a divalent organic group selected from General Formula Group (2):

[Chem. 4]

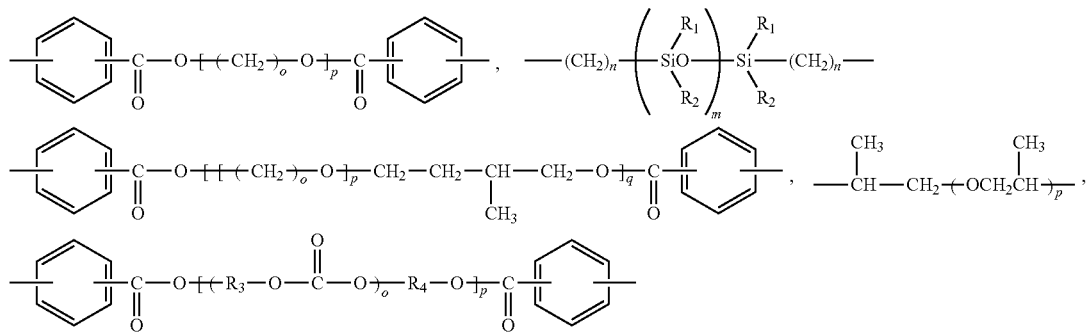

Group (2)

wherein o, p, and q each independently represent an integer of 1 to 30; $R_1$ and $R_2$ each independently represent an alkyl group having 1 to 12 carbon atoms or an aromatic group; m represents an integer of 1 to 40; n represents an integer of 1 to 20; and $R_3$ and $R_4$ each independently represent an alkylene group having 1 to 12 carbon atoms.

5. The polyimide precursor composition as set forth in claim 2, wherein R" in General Formula (2) is a divalent organic group selected from General Formula Group (3):

[Chem. 5]

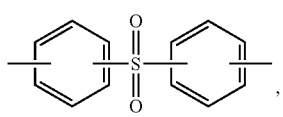

Group (3)

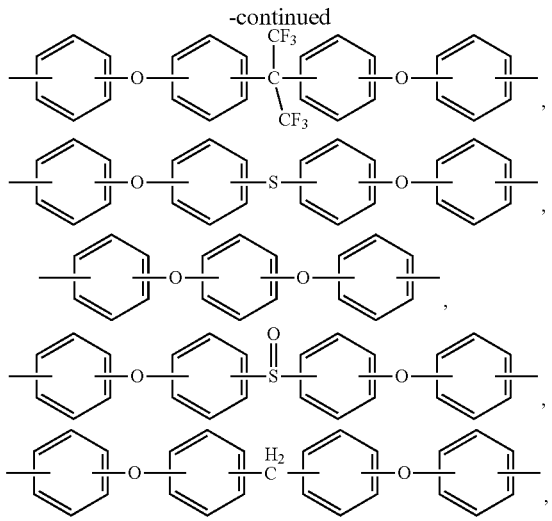

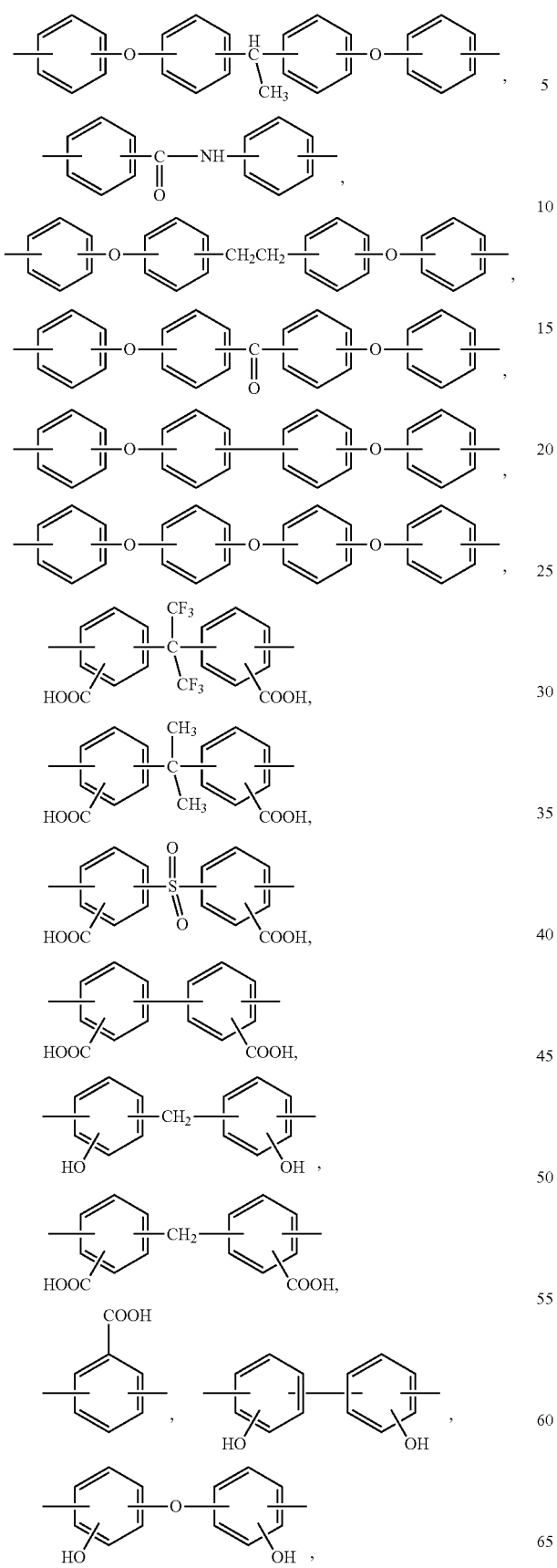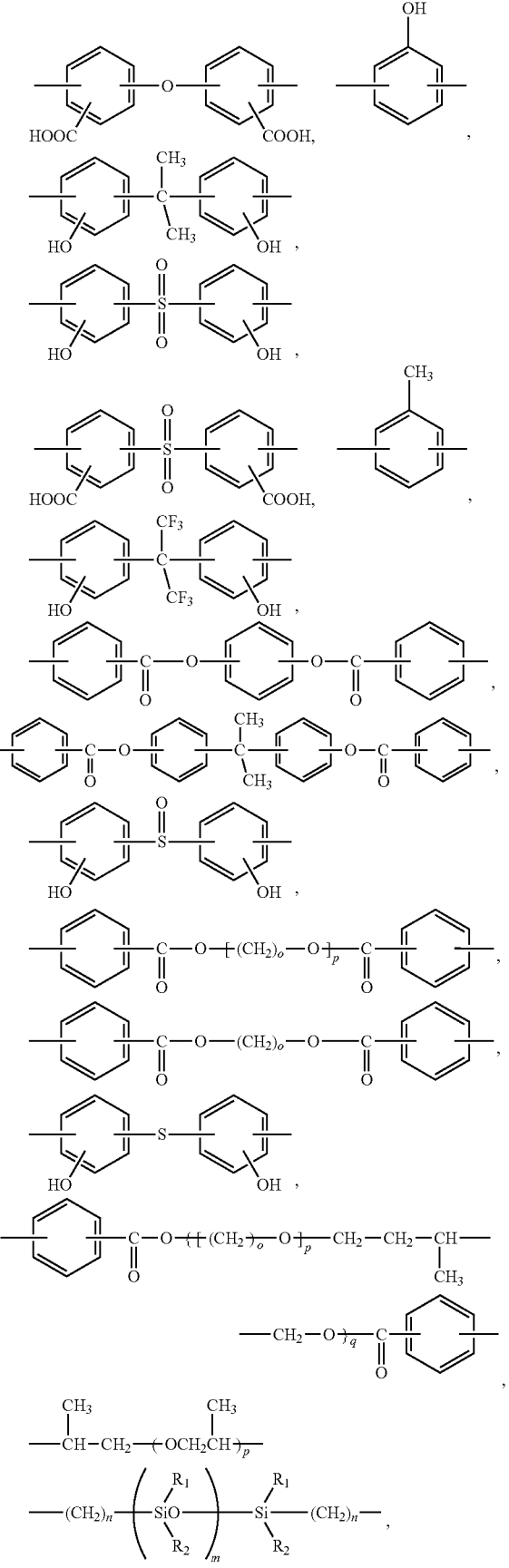

-continued

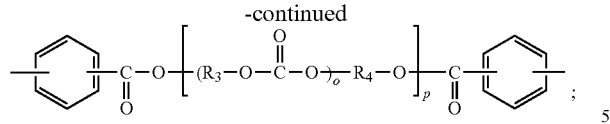

wherein o, p, and q each independently represent an integer of 1 to 30; $R_1$ and $R_2$ each independently represent an alkyl group having 1 to 12 carbon atoms or an aromatic group; m represents an integer of 1 to 40; n represents an integer of 1 to 20; and $R_3$ and $R_4$ each independently represent an alkylene group having 1 to 12 carbon atoms.

6. A polyimide precursor composition solution obtained by dissolving a polyimide precursor composition as set forth in claim 1 so that the polyimide precursor composition solution has a solute concentration of 40 to 90% by weight.

7. A polyimide coating film obtained from either a polyimide precursor composition as set forth in claim 1.

* * * * *